(12) United States Patent
Baker et al.

(10) Patent No.: US 8,156,458 B2
(45) Date of Patent: Apr. 10, 2012

(54) UNIQUIFICATION AND PARENT-CHILD CONSTRUCTS FOR 1XN VLSI DESIGN

(75) Inventors: Matthew W. Baker, Holly Springs, NC (US); Benjamin J. Bowers, Cary, NC (US); Anthony Correale, Jr., Raleigh, NC (US); Irfan Rashid, Cary, NC (US); Paul M. Steinmetz, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 392 days.

(21) Appl. No.: 12/201,685

(22) Filed: Aug. 29, 2008

(65) Prior Publication Data

US 2010/0058269 A1    Mar. 4, 2010

(51) Int. Cl.
*G06F 17/50* (2006.01)
*G06F 9/455* (2006.01)

(52) U.S. Cl. ........ 716/107; 716/103; 716/104; 716/105; 716/106; 716/110; 716/111; 716/132; 716/136; 703/13; 703/14

(58) Field of Classification Search .......... 716/100–108, 716/116–117, 110–111, 132, 136; 703/13–14
See application file for complete search history.

(56) References Cited

U.S. PATENT DOCUMENTS

| | | | |
|---|---|---|---|
| 4,377,489 A | 3/1983 | King | |
| 5,301,318 A | 4/1994 | Mittal | |
| 5,455,775 A | 10/1995 | Huber et al. | |
| 5,790,416 A * | 8/1998 | Norton et al. | 716/102 |
| 5,805,860 A * | 9/1998 | Parham | 716/101 |
| 6,009,251 A | 12/1999 | Ho et al. | |
| 6,113,647 A | 9/2000 | Silve et al. | |
| 6,230,304 B1 | 5/2001 | Groeneveld et al. | |
| 6,317,860 B1 | 11/2001 | Heile | |
| 6,324,671 B1 | 11/2001 | Ratzel et al. | |
| 6,496,995 B1 * | 12/2002 | Quinn | 5/658 |
| 6,634,017 B2 | 10/2003 | Matsui et al. | |
| 6,701,489 B1 | 3/2004 | Lam | |
| 6,735,754 B2 | 5/2004 | Mehrotra et al. | |

(Continued)

OTHER PUBLICATIONS

Hao Li et al., "Feedback Driven High Level Synthesis for Performance Optimization," ASIC, 2005, ASICON 2005, 6th International Conference, vol. 2, 24-27, Oct. 2005, pp. 961-964.

(Continued)

*Primary Examiner* — Nghia Doan
(74) *Attorney, Agent, or Firm* — Henri D. Schnurmann; Schubert Law Group PLLC

(57) ABSTRACT

Embodiments that create parent-child relationships for reuse of 1×N building blocks in a closed-loop 1×N system are disclosed. Some methods comprise generating a representation of an IC design, inserting a first 1×N building block into the representation, and creating an association between the first 1×N building block and a second 1×N building block. The association enables the first 1×N building block to inherit alterations of attributes of the second 1×N building block and enables unique alterations of attributes of the first 1×N building block which differ from the second 1×N building block. Further embodiments comprise an apparatus having an equivalency determiner to determine a logical equivalence between a two 1×N building blocks, an attribute creator that creates a set of attributes and enables one of the 1×N building blocks to inherit parent attributes and comprise child attributes.

23 Claims, 11 Drawing Sheets

U.S. PATENT DOCUMENTS

| | | | |
|---|---|---|---|
| 6,738,958 B2* | 5/2004 | Manoo | 716/111 |
| 6,754,879 B1 | 6/2004 | Alferness et al. | |
| 6,766,502 B1 | 7/2004 | Pyo et al. | |
| 6,782,520 B1 | 8/2004 | Igusa et al. | |
| 6,795,960 B1 | 9/2004 | Kong | |
| 6,883,156 B1 | 4/2005 | Khainson et al. | |
| 6,886,140 B2 | 4/2005 | Regnier | |
| 6,925,621 B2* | 8/2005 | Mielke et al. | 716/103 |
| 6,938,237 B1 | 8/2005 | El-Ghoroury | |
| 6,966,044 B2 | 11/2005 | Reuland et al. | |
| 7,065,729 B1 | 6/2006 | Chapman | |
| 7,124,380 B2 | 10/2006 | Keller et al. | |
| 7,168,059 B2 | 1/2007 | Bowyer et al. | |
| 7,178,116 B2 | 2/2007 | Takeuchi | |
| 7,310,787 B2 | 12/2007 | Prakash et al. | |
| 7,328,143 B2 | 2/2008 | McGaughy | |
| 7,340,712 B2 | 3/2008 | Correale | |
| 7,503,021 B2* | 3/2009 | Boucher et al. | 716/136 |
| 7,827,513 B2 | 11/2010 | Palumbo et al. | |
| 2003/0225565 A1 | 12/2003 | Garcia et al. | |
| 2004/0117746 A1 | 6/2004 | Narain et al. | |
| 2005/0210428 A1 | 9/2005 | Keller et al. | |
| 2005/0251771 A1 | 11/2005 | Robles | |
| 2006/0101355 A1 | 5/2006 | Ciplickas et al. | |
| 2006/0143589 A1 | 6/2006 | Horng et al. | |
| 2006/0190905 A1 | 8/2006 | Martin et al. | |
| 2006/0265674 A1 | 11/2006 | Scheffer | |
| 2007/0011637 A1 | 1/2007 | Seidl et al. | |
| 2007/0079274 A1 | 4/2007 | Tetelbaum | |
| 2007/0083839 A1 | 4/2007 | Lahner et al. | |
| 2007/0266346 A1 | 11/2007 | Wu | |
| 2007/0288871 A1 | 12/2007 | McElvain et al. | |
| 2007/0294655 A1 | 12/2007 | Campos et al. | |

OTHER PUBLICATIONS

Sebastien Bilavarn et al., "Design Space Pruning Through Early Estimations of Area/Delay Tradeoffs for FPGA Implementations," IEEE Transactions on Computer-Aided Design of Integrated Circuits and Systems, vol. 25, Issue 10, Oct. 2006, pp. 1950-1968.

Srinivasan, A., et al., "Accurate Area and Delay Estimation from RTL Descriptions," IEEE Transactions on Very Large Scale Integration (VLSI) Systems, vol. 6, Issue 1, Mar. 1998, pp. 168-172.

Correale Jr., et al., "Macro/Cell Compiler Custom Realization for Disjoint or Integrated Logical and Physical Design Databases," IBM Technical Disclosure Bulletin, Sep. 1991, pp. 196-201.

U.S. Appl. No. 12/200,076, Anthony Correale Jr. et al.
U.S. Appl. No. 12/200,016, Paul M. Steinmetz et al.
U.S. Appl. No. 12/201,591 Anthony Correale, Jr. et al.
U.S. Appl. No. 12/200,121, Benjamin J. Bowers et al.
U.S. Appl. No. 12/201,643, Anthony L. Polomik et al.
U.S. Appl. No. 12/256,594, Benjamin J. Bowers et al.

* cited by examiner

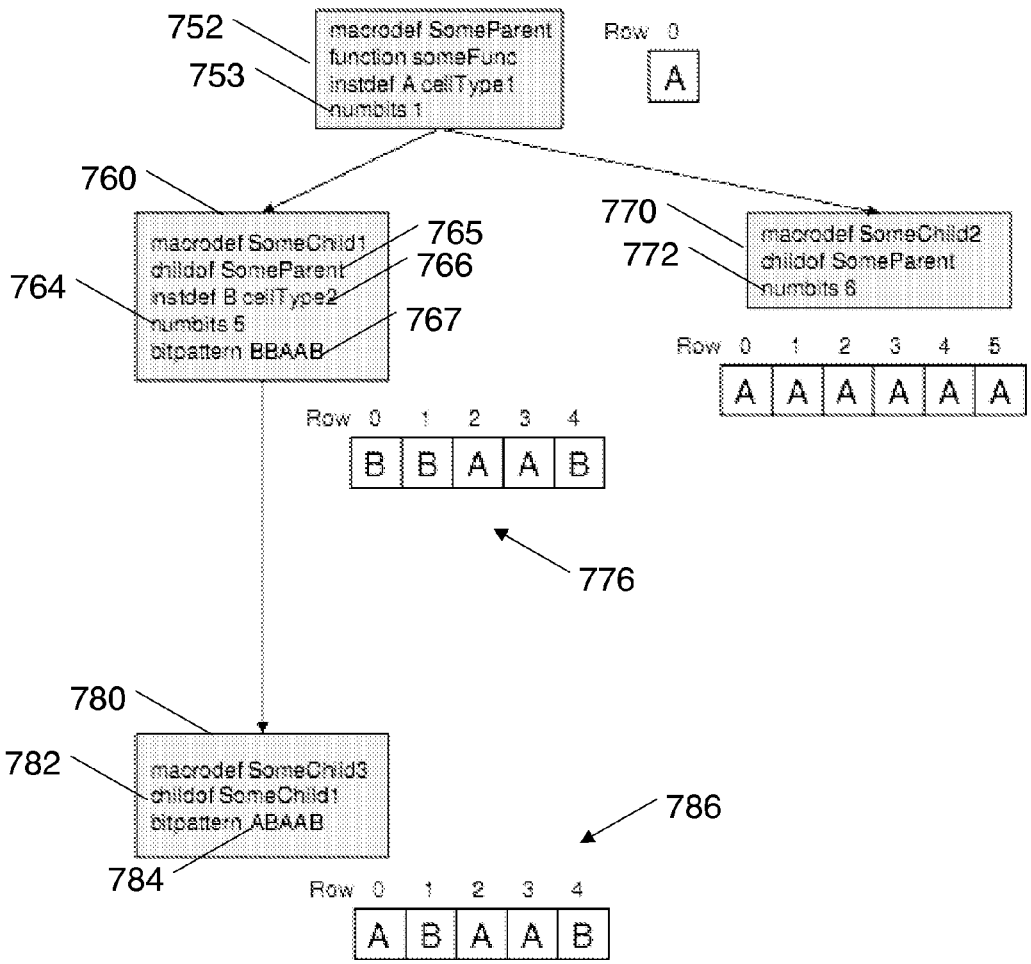
FIG 7B: 1xN PARENT/CHILD RELATIONSHIP
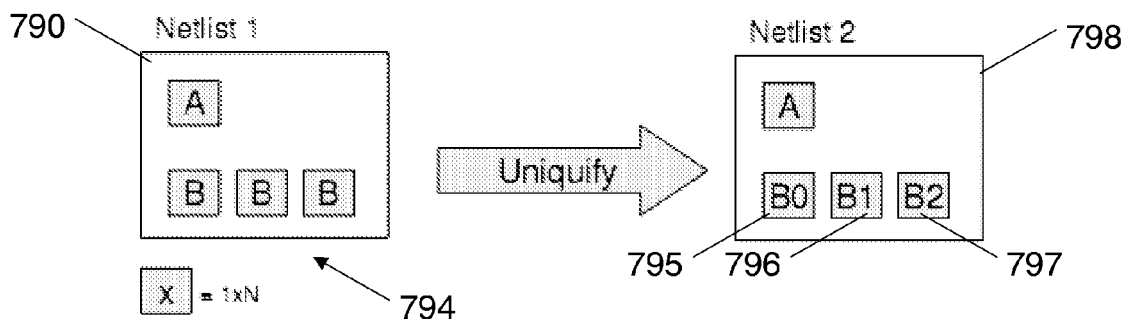
FIG 7C: UNIQUIFICATION

UNIQUIFICATION AND PARENT-CHILD CONSTRUCTS FOR 1XN VLSI DESIGN

BACKGROUND

The present invention generally relates to the field of integrated circuits (ICs). More particularly, the present invention relates to methods, systems, and computer program products to create parent-child relationships for reuse of 1×N building blocks in a closed-loop 1×N system. The integrated circuits of today commonly have hundreds of millions of transistors on a single chip, with many critical circuit features having measurements in the deep sub-micron range. As manufacturers implement more and more circuit elements in smaller and smaller silicon substrate surface areas, engineers and designers develop hardware and software tools to automate much of the integrated circuit design and manufacturing process.

The classical design methodology for designing and manufacturing integrated circuits employs an open-loop design process whereby the activities of logic capture and physical realization are separate and lack coherency. For example, a team of designers generally start with a conceptual design, develop associated logic, perform synthesis of the logic design to develop an associated physical design, and analyze the physical design for timing performance. During these phases, designers may make adjustments to the one or more circuit devices, such as changing parameters of drive strength or making power optimizations. If the register transfer level (RTL) design is not frozen, the designers may develop or change the logic, perform the synthesis to create another physical design, and analyze the new design. Until designs of the integrated circuits reach a "logic-freeze" stage, at which point synthesis stops, design improvements from physical optimizations are often lost for the iterations through the design flow. Such optimizations are often necessary for meeting design goals related to operating frequencies and power consumption.

To add to the complexity of the design process, some design implementations define specific logic functions for which there are one-for-one physical realizations. The physical realizations are often fixed entities, both logically and from the standpoint of electrical realization. For these specific design implementations, a circuit designer and/or physical designer generally need to know details of the specific design at a very early stage in the design process. Additionally, the designer must have the ability to craft the specific design. As the design progresses, the designer routinely needs to optimize the design to reduce power consumption, increase performance, and reduce the amount of the required area. Current methods of maintaining physical optimizations before a design reaches the stage of logic freeze include manual instantiation of gates and manual changes to the synthesis flow to produce predictable and repeatable results. Designers spend considerable time optimizing the circuits because the optimizations require manual intervention and constant updating for individual iterations through the design flow.

BRIEF SUMMARY

Following are detailed descriptions of embodiments depicted in the accompanying drawings. The descriptions are in such detail as to clearly communicate various aspects of the embodiments. However, the amount of detail offered is not intended to limit the anticipated variations of embodiments. On the contrary, the intention is to cover all modifications, equivalents, and alternatives of the various embodiments as defined by the appended claims. The detailed descriptions below are designed to make such embodiments obvious to a person of ordinary skill in the art.

Generally speaking, methods, apparatuses, and computer program products to create parent-child relationships for reuse of 1×N building blocks in a closed-loop 1×N system are disclosed. Some methods comprise generating a representation of an IC design, inserting a first 1×N building block into the representation, and creating an association between the first 1×N building block and a second 1×N building block. In the embodiments, the first 1×N building block and the second 1×N building block are logically equivalent and the association enables the first 1×N building block to inherit alterations of attributes of the second 1×N building block and prevents alterations of attributes of the first 1×N building block from being inherited by the second 1×N building block.

Further embodiments comprise an apparatus having an equivalency determiner to determine a logical equivalence between a first 1×N building block and a second 1×N building block. The apparatus also includes an attribute creator that creates a set of attributes for the first 1×N building block, enabling the first 1×N building block to inherit a parent attribute of the second 1×N building block and comprise a child attribute, with the child attribute differing from a corresponding attribute of the second 1×N building block. Further, the apparatus has a representation generator to generate a second representation that has the parent attribute and the child attribute.

Even further embodiments comprise a computer program product comprising a computer readable medium having a computer readable program, wherein the computer readable program causes the computer to determine a logical equivalency of a first 1×N building block and a second 1×N building block. The computer readable program also causes the computer to create a set of attributes of the first 1×N building block that enable a first attribute of the first 1×N building block to equal a parent attribute of the second 1×N building block and enable the first 1×N building block to comprise a child attribute that differs from attributes of the second 1×N building block. Further, the computer readable program also causes the computer to modify the representation based on the parent attribute and the child attribute.

Even further embodiments comprise a design structure embodied in a machine readable medium used in a design process, with the design structure comprising an equivalency determiner, an attribute creator, and a representation generator. The equivalency determiner determines a logical equivalence between a first 1×N building block and a second 1×N building block. The property creator creates a set of attributes of the first 1×N building block that enables the first 1×N building block to inherit a parent attribute of the second 1×N building block and enables the first 1×N building block to comprise a child attribute, wherein the child attribute differs from a corresponding attribute of the second 1×N building block. The representation generator generates a second representation that comprises the parent attribute and the child attribute.

BRIEF DESCRIPTION OF THE SEVERAL VIEWS OF THE DRAWING

Aspects of the various embodiments will become apparent upon reading the following detailed description and upon reference to the accompanying drawings in which like references may indicate similar elements:

FIG. 7B illustrates how parent-child relationships may be implemented for 1×N building blocks in one embodiment;

FIG. 7C illustrates uniquification for 1×N building blocks in one or more embodiments;

DETAILED DESCRIPTION

Figure 1:
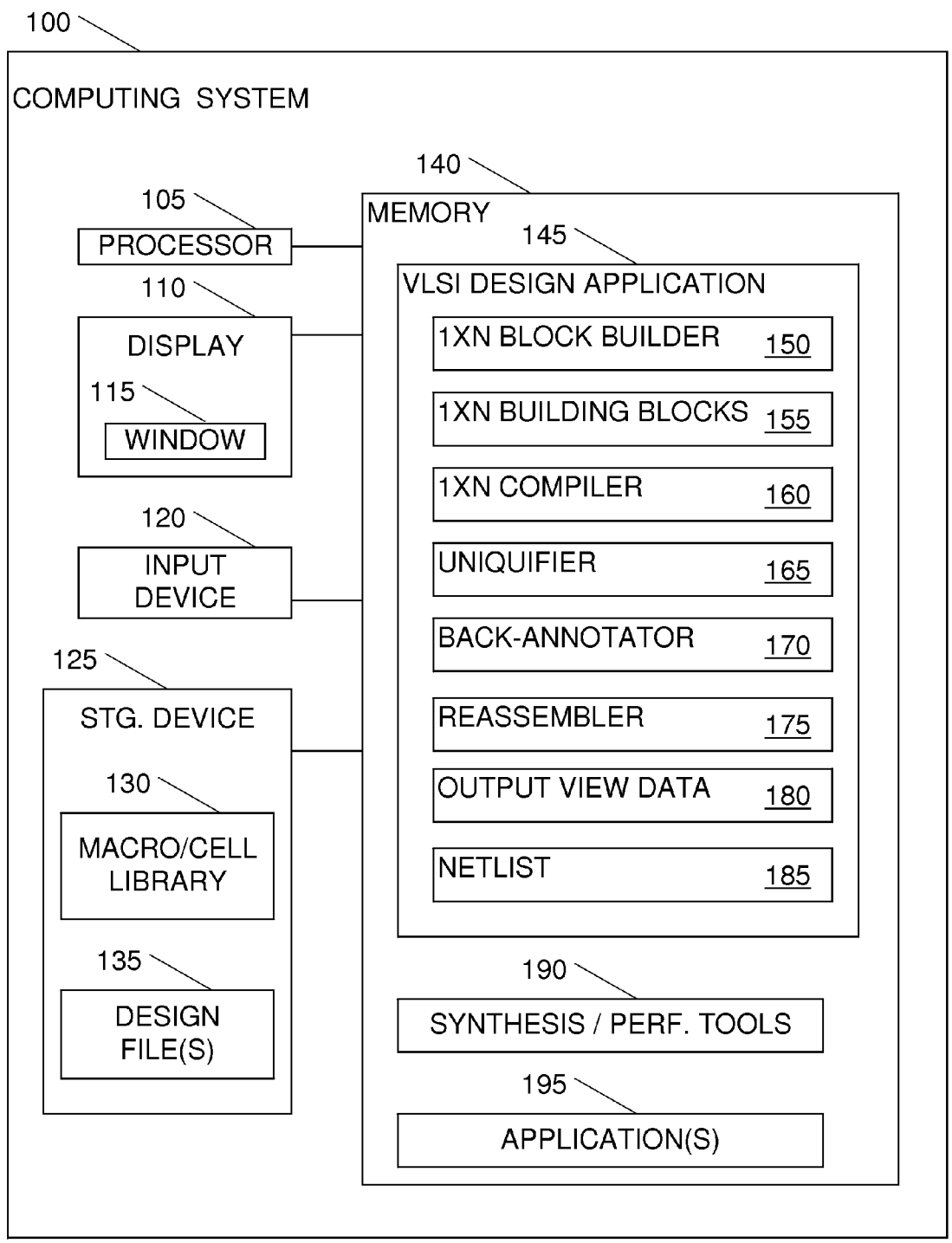
FIG. 1 depicts a computing system that may design integrated circuits using a closed loop 1×N methodology that has parent-child relationships of 1×N building blocks.

The following is a detailed description of novel embodiments depicted in the accompanying drawings. The embodiments are in such detail as to clearly communicate the subject matter. However, the amount of detail offered is not intended to limit anticipated variations of the described embodiments. To the contrary, the claims and detailed description are to cover all modifications, equivalents, and alternatives falling within the spirit and scope of the present teachings as defined by the appended claims. The detailed descriptions below are designed to make such embodiments understandable to a person having ordinary skill in the art.

Many of the embodiments contained herein describe using 1×N building blocks to design an integrated circuit. A circuit layout or circuit design may comprise a hierarchical collection of circuit elements or cells. A building block, or macro, may generally refer to the concept that a circuit may comprise a plurality of different circuit elements or cells, wherein the cells may be divided into categories. These categories may be basic cells, level cells, and building blocks. Basic cells, which may alternatively be referred to as leaf cells, may comprise an aggregation of circuit elements, such as a collection of logic gates, and may be thought of as residing at the bottom of the design hierarchy. Basic cells may be nested together, along with other circuit elements, to form level cells at different mid-levels within the design hierarchy. The level cells, which are frequently referred to as composition cells, may be further nested together to form building blocks, alternatively referred to as macros, which may also be referred to as root cells or prime cells. Building blocks may be thought of as residing at the top of the design hierarchy. Building blocks may also be referred to as blocks or modules.

1×N building blocks may contain a homogeneous collection of cells, also commonly referred to as bits, or contain an inhomogeneous collection of cells. For example, one 1×N building block may contain four AND gates while another 1×N building block may contain two AND gates, three NAND gates, and two OR gates, as well as auxiliary bits or cells. Additionally, while some bits of 1×N building blocks may be relatively simple, such as comprising a latch, some bits may also comprise a more complex collection of elements, such as comprising multiplexers.

The use of a cell at a specific level in the design hierarchy may be referred to as a cell instance, or instantiation. A circuit with only one hierarchical level is said to be flat. During a design sequence a VLSI design system may need to flatten a circuit design, converting the hierarchical levels into a single level, so that certain design tools may work with the design. For instance, a circuit simulation tool or a circuit optimization tool may only be able to simulate or optimize a circuit design that has a flattened netlist. A VLSI design system may flatten, or fully instantiate, a circuit design by recursively replacing all cell instances with basic circuit elements like resistors and capacitors.

Additionally, many of the embodiments use the term "optimized" and or "tuned". As one skilled in the art of integrated circuit design will appreciate, such terms as "tuned", "optimal", and "optimized" as used in the design process may refer to a portion of an integrated circuit that has been altered to comply with some design constraint. For example, a simulation tool may determine drive strength for a specific gate in the circuit, selecting a parameter for the drive strength that makes a tradeoff between two or more competing interests, such as speed versus power consumption. Consequently, such terms should not be interpreted as choosing "optimal" or "best" settings, since such settings or parameters may often be subjective in nature. Such terms should therefore be considered in the context of integrated circuit design, consistent with the manner in which the terms are used by those possessing ordinary skill in the art.

Some of the discussion that follows uses the term "cloned bit". A cloned bit, or cloned cell, may comprise a duplicate of another bit/cell of a 1×N building block, such that the cloned bit operates in a manner identical or sufficiently similar. For example, a circuit designer may find that a particular bit does not have sufficient drive strength to drive the total connected fan-out load. To address the problem, the circuit designer or an automated tool may make a cloned bit of the bit having insufficient drive strength for the load and use the cloned bit to drive a portion of the total load. In other words, the circuit designer may divide the load into two or more loads, connected to two or more separate nodes, and use two or more cloned bits to "share" the load.

Further, some of the discussion that follows uses the terms "logical equivalency" and "inverted logical equivalency" when referring to bits and/or cells of 1×N building blocks. Two different bits of two different 1×N building blocks may be logically equivalent if the output states of each bit equals the other bit for all combinations of input states, even though the bits may have different parameters, such as different drive strengths and different timing responses based on such circuit conditions as capacitance, wire resistance, etc. Similarly, two different bits of two different 1×N building blocks may have an inverted logical equivalency if the output states of one bit are the complements of the other bit for each of the possible input combinations. As people skilled in the art will appreciate, a circuit designer may sometimes duplicate a 1×N building block, yet change the polarity of one or more of the output bits to address, e.g., output drive problems or output net issues.

For the purpose of this disclosure, two different 1×N building blocks may be said to be logically equivalent, even though one of the 1×N building blocks may have several bits possessing an inverted logical equivalency, when compared to the corresponding bit of the other 1×N building block. Additionally, some 1×N building blocks may be said to be logically equivalent, even though one building block may have more bits than the other. For example, one parent 1×N building may comprise four NAND cells. A child of the parent may comprise eight NAND cells. The parent and child 1×N building blocks may be treated as logical equivalents, based on the similarity of the cell types. Consequently, for the purpose of interpretation with this disclosure, "logically equivalent" 1×N building blocks may be treated as an "equivalent" based on a substantial similarity of the manner in which the cells behave, based on a comparison of the two 1×N building blocks.

Persons having ordinary skill in the art often use various titles for persons performing different tasks of creating an integrated circuit design. For example, some refer to a design engineer as a person that performs such tasks as receiving specifications, creating behavioral and logical circuit designs, running simulations, and evaluating prototypes that are fabricated. Similarly, some refer to a test engineer as a person that develops a test plan for a circuit design based on the specification and actually performs simulations of the design and/or physical tests of a fabricated prototype. Some may refer to a computer aided design (CAD) engineer as a person that uses CAD tools, such as schematic capture, simulation, synthesis, layout, and power estimation tools to evaluate and modify the circuit design. Due to the difference in use of titles, which may vary greatly, this specification uses the terms circuit designer, logic designer, or simply designer to refer to a person that may perform any of the described tasks for creating the circuit design. In other words, the terms circuit designer, logic designer, designer may be substituted interchangeably in the specification, and should not be interpreted as referring to a person that may only perform specific tasks. To the contrary, the terms circuit designer, logic designer, designer may refer to persons that can perform any of the tasks described herein, such as the tasks of behavioral design, logical design, physical design, and timing analysis/design.

Turning now to the drawings, FIG. 1 illustrates a computing system 100 that may design integrated circuits using a closed-loop 1×N methodology. For example, computing system 100 may comprise a design workstation or a desktop computer executing a very-large-scale integration (VLSI) design application 145 in memory 140. A circuit designer may receive a specification for an integrated circuit (IC). Based on the specification, the circuit designer may define architecture for the IC and develop a circuit design for the IC at a very high level of abstraction. The circuit designer may then transfer the high-level circuit design to a physical designer. The physical designer may use computing system 100 and VLSI design application 145 to convert the high-level circuit design into a very low-level circuit description, or tape out, which may be used to actually fabricate the IC.

VLSI design application 145 may provide a closed-loop environment that employs high-level 1×N constructs for tuning performance and power consumption. VLSI design application 145 may capture logic using both high-level RTL and references to 1×N building blocks. VLSI design application 145 may represent the 1×N building blocks via a high-level language and transform the 1×N building blocks into custom realizations using, e.g., building blocks available in a standard or custom cell library.

In various embodiments, a system may have a processor, such as processor 105, for executing program instructions of applications, such as VLSI design application 145. While executing program instructions of VLSI design application 145, computing system 100 may display images of the circuit design, or information pertaining to simulation or performance tuning, on a monitor or other computer display, such as display 110. For example, VLSI design application 145 may generate pictorial schematic elements, as well as wires connecting the various schematic elements, for a schematic in a window 115 on display 110.

Using input device 120 a circuit designer may interact with VLSI design application 145. In one or more embodiments, input device 120 may comprise a keyboard and/or a mouse, allowing the circuit designer to perform such actions as viewing different circuit sections or performing numerous circuit design activities such as performing a timing analysis, increasing the drive strength of a gate, or defining which circuit elements should not be modified during various design cycle iterations. In some embodiments input device 120 may comprise a tablet and stylus, such as a pressure-sensitive surface or a capacitance pad that recognizes hand-written characters and stylus movement. In even further embodiments input device 120 may comprise an audible input device, such as a microphone used for speech recognition. For example, in one embodiment input device 115 may allow a circuit designer to automate one or more tasks during the design flow, such as by recognizing when the circuit designer speaks the phrase "calculate Vt-hybridization values for selected 1×N building blocks".

Display 110 and input device 120 may also allow the circuit designer to interact with VLSI design application 145 when creating, viewing, and manually modifying various 1×N building blocks 155. For example, 1×N block builder 150 may allow a circuit designer to retrieve a 1×N building block from a cell library 130, stored on a storage device 125. Storage device 125 may comprise a local solid state drive or a network hard drive, as examples, which stores standard cells and various instantiations created by a circuit designer. Upon retrieving a 1×N logic block, 1×N block builder 150 may allow a circuit designer to edit the 1×N building block by displaying configuration information for the 1×N building block in window 115. After editing the 1×N building block, VLSI design application 145 may save the edited version back to cell library 130.

Figure 2:
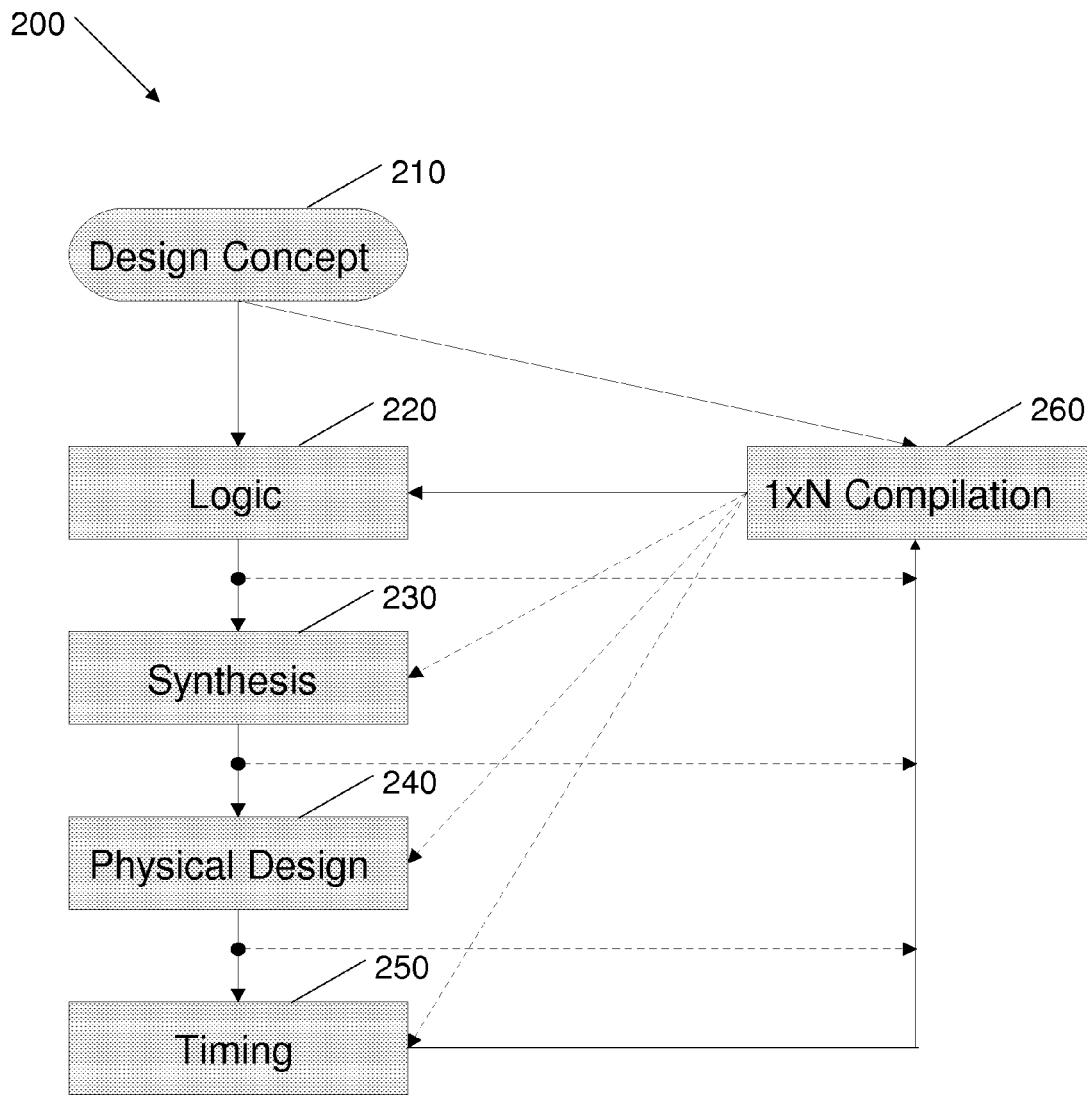
FIG. 2 is a flowchart illustrating different phases of a 1×N design process, including a 1×N compilation stage.

In the embodiment depicted in FIG. 1, VLSI design application 145 may design an IC using a closed-loop 1×N methodology, the specific details of which will be discussed later. However, to gain a general understanding of some of the steps that may be involved in reassembling hierarchical representations in a closed loop 1×N system, as well as how this closed loop system may differ from an open-loop design system, one may examine FIG. 2. FIG. 2 shows a flowchart 200 illustrating how a design for an IC may begin with a design concept 210.

The product of the design concept 210 may be a flowchart, a flow graph, or pseudocode. The designer may specify the overall functionality and input-to-output mappings without developing architectural or hardware details for the circuit design. Based on the design concept 210 the circuit designer may develop a behavioral description of the circuit during logic phase 220, such as by using a high-level language to define how the circuit should work at a high level of abstraction. More specifically, the circuit designer may write a hardware description of the IC using a hardware description language (HDL), such as Verilog or VHDL (very-high speed integrated circuit HDL). As is known to those skilled in the art, the high-level code or behavioral representation may be referred to as RTL netlists. At the RTL level, the behavioral description may consist of program-like constructs, such as, variables, operators, conditionals, loops, procedures and functions.

The circuit designer may then simulate the design, or different portions of the design, by using one or more behavioral tools to verify the design works as intended. For example, the circuit designer may apply input combinations and/or sequences of data to different modules to verify that the modules respond as intended. After the hardware description of the design has been through several iterations, and exhibits some degree of operability and stability, the circuit designer may convert the HDL code to a logical representation via a synthesis phase 230. During synthesis phase 230, a VLSI design application may convert the HDL definition of the circuit, transforming the textual descriptions of the behavioral representation to logic gates. In other words, the synthesis phase 230 may transform the VHDL code into a netlist describing the hardware, which may comprise circuit elements and the wires connecting them.

The logical representation may comprise gate-level logic, such as AND, OR, NOT, NAND, and NOR gates, to name just a few. The gate-level logic may be arranged to implement the desired functionality described in the high-level HDL code. The tools that perform the conversion from the high-level description to the gate-level logic are generally called synthesis tools. For example, a set of synthesis programs from Synopsys® may perform the conversion from the high-level code to the logic-level code. As is known to those skilled in the art, the logical representation, or logic-level code, may be referred to as gate-level netlists. The logical representation may comprise a netlist of high-level macrocell components, such as adders, pipelined multipliers, arithmetic logic units, multiplexers, and register-files. Each macrocell, or building block, may have a corresponding netlist of primitive cells as well as a corresponding custom layout. This gate-level netlist of primitive cells and the layout may be generated using a silicon compiler tool, like 1×N compiler 160.

Once the high-level code is converted to gate-level code, the designer may perform additional testing via simulation and formal verification in order to verify that the gate-level netlists accurately represent the RTL netlists. In other words, one or more synthesis tools and/or behavioral tools may help the designer determine whether the logical design accurately represents what the behavioral design describes. If the logic-level code is successfully verified, a circuit designer may use one or more physical design tools to convert the logic level code into a detailed layout of structural components or elements of the circuit in physical design phase 240. The detailed layout of structural components may generally be referred to as a physical design representation. The physical design representation may comprise different forms and formats from embodiment to embodiment, as well as in the same embodiment. For example, persons having ordinary skill in the art may refer to different forms of the physical design representations using such terms as the physical realization, the hierarchical physical design (PD) netlist, the flattened netlist, the physical view, the physical placement data, the electrical realization, or simply netlist.

Two common forms of the physical design representations are the hierarchical PD netlist and the flattened netlist. As noted, the hierarchical PD netlist and the flattened netlist may represent the physical design produced during the physical design stage 240. Based on the physical design representation, the circuit designer may use one or more timing analysis tools during a timing phase 250 to evaluate the timing performance of the design. Assuming the timing performance is acceptable, the circuit designer may release the flattened netlist or the hierarchical netlist to a semiconductor fabrication facility to produce the IC.

The circuit designer may have to repeat one or more of the design activities numerous times before reaching the final physical design. For example, once the designer creates the gate-level logic in logic phase 220 and simulates the design via one or more simulation tools, the designer must often make changes to the HDL definition and create a modified version of the gate-level logic. Simulating the modified logic may uncover more design deficiencies that the circuit designer must correct. In other words, the circuit designer may have to pass through logic phase 220 numerous times.

Aside from logic changes, the circuit designer may also need to alter the design to correct problems encountered after synthesis phase 230, physical design phase 240, and timing phase 250. For example, the circuit designer may progress through the design process to the point where the design works perfectly under simulation, but finds that a routing tool cannot create a functional wiring arrangement for the design, due to rule restrictions or area constraints. Alternatively, one or more optimization tools may generate changes to the design. One such example may be incremental performance improvements, such as reduced delays, produced by iteratively feeding the results of a place and route (P&R) tool back into a synthesis tool.

During an open-loop design sequence, the circuit designer may need to exert caution to prevent having the accumulated design improvements altered or negated, due to disjointed activities of capturing logic in logic phase 220 and developing the physical design in physical design phase 240. Until the design reaches the logic-freeze stage, which halts subsequent synthesis in synthesis phase 230, physical optimizations such as tweaks made for drive strengths and power optimization may be lost during subsequent synthesis iterations. Using a closed-loop methodology offered by 1×N compilation 260, an application like VLSI design application 145 may maintain these physical optimizations without depending on disjointed tools and databases.

1×N compilation 260 may allow a VLSI design system to employ a closed-loop design process whereby physical implementation details, such as alterations due to drive strength and power optimization, may be fed back into each step of the design process. The VLSI design system may feed the design alterations back to the different design phases by using 1×N building blocks and inserting data generated by compiling the 1×N building blocks back into the design flow.

A VLSI design system may use a 1×N compiler during 1×N compilation 260 to create, modify, and maintain 1×N macros through the design process. As will be illustrated in the subsequent discussion of the various embodiments, the 1×N compiler may directly update the configuration file or files of a circuit design in a closed-loop manner. Additionally, the 1×N compiler may support direct wiring, have built-in design-for-manufacturability features, and have hierarchical wiring avoidance, and hierarchy reassmbly. For example, a designer may make numerous physical optimizations to a flat netlist, such as tweaks made for drive strengths and power optimization during physical design phase 240 and/or timing phase 250. To prevent such physical optimizations from being lost, 1×N compilation 260 may reassemble one or more hierarchical representations from the flat netlist via attributes associated with the flat netlist. In other words, using a closed-loop methodology offered by 1×N compilation 260, an application like VLSI design application 145 may maintain these physical optimizations without depending on disjointed tools and databases.

As FIG. 2 illustrates, the 1×N design methodology may involve a primary design loop and secondary design loops. The solid lines between design concept 210, logic phase 220, synthesis phase 230, physical design phase 240, timing phase 250, 1×N compilation 260, and back to logic phase 220 may represent the closed-loop nature of the primary design loop. The primary design loop shows the design flow through various stages of the design. Circuit designers may spend large quantities of time engaged in the various activities of the primary design loop, which may be characterized as the pre-logic-freeze design flow. In other words, the optimization decisions made in each phase of the methodology, such as synthesis phase 230, physical design phase 240, and timing phase 250, may be fed back into logic phase 220 via 1×N compilation 260 to iterate through the primary design loop again. Iterations through the primary design loop may involve changing 1×N building blocks and/or logical RTL structure. Each iteration or progression through the primary design loop may provide an improved starting seed for automated synthesis and optimization algorithms.

FIG. 2 also illustrates a number of smaller secondary design loops represented by the dashed lines. For example, one of the secondary design loops may comprise the loop defined by progressing from logic phase 220 to 1×N compilation 260, back to logic phase 220. Another secondary design loop may comprise the loop defined by progressing from 1×N compilation 260, to synthesis phase 230, to physical design phase 240, and back to 1×N compilation 260. The dashed lines may represent iterative changes through individual design phases and/or through iterative loops of multiple phases of the design, without necessarily progressing through the complete primary design loop. A 1×N design system may employ a closed-loop process to feed optimizations developed in a single design phase into another design phase without necessarily losing physical information.

With a general understanding of some of the steps that may be involved in the closed-loop 1×N methodology, we return now to FIG. 1. In various embodiments, a computing system like computing system 100 may execute a variety of different applications in addition to VLSI design application 145. For example, computing system 100 may execute a synthesis application and/or performance tuning tools 190. In one or more embodiments, tools 190 may represent a number of different applications comprising a tool suite. A circuit designer may use tools 190 to transform Verilog or VHDL code into a netlist describing the hardware for the physical design. A circuit designer may also use tools 190 to simulate the circuit design, perform timing analyses of the design, and generate a routing design for the circuit elements. In other words, tools 190 may comprise one or more applications that may work in conjunction with VLSI design application 145 and alter the circuit design as the circuit designer progresses through the various design stages, as illustrated in FIG. 2.

While FIG. 1 shows tools 190 to be separate from VLSI design application 145, in many embodiments one or more of the components of tools 190 may be integrated within VLSI design application 145. For example, VLSI design application 145 may perform synthesis actions and/or timing analysis functions without needing to resort to external applications. Additionally, in different embodiments, computing system 100 may execute one or more applications 195 that are unrelated to creating an integrated circuit design. For example, if computing system 100 comprises a workstation connected to the Internet, applications 195 may comprise a web browser application and an e-mail application. Alternatively, in embodiments where system 100 comprises a server, applications 195 may comprise a web server application or a database application.

Depending on the embodiment, computing system 100 may run a variety of different operating systems. For example, in one embodiment computing system 100 may use AIX. In another embodiment, computing system may use Microsoft® Windows®, Linux®, or Mac OS®, as examples. Other alternative embodiments may have no operating system at all. For example, computing system 100 may comprise a state machine or microcontroller executing firmware instructions, such that no operating system is necessary.

One or more design files 135 may be stored on a storage medium of storage device 125 and accessed by computing system 100. For example, storage device 125 may comprise one or more of a variety of different mass storage devices used to store VLSI design files 135 and macro and/or cell library 130. For example storage device 125 may comprise a serial hard disk drive or a small computer system interface (SCSI) redundant array of inexpensive disks (RAID). Alternatively, storage device 125 may also comprise an optical storage device, such as a rewritable compact disc (CD) or a digital versatile disc (DVD) drive, having storage mediums of a CD and DVD, respectively. In other embodiments, storage device 125 may comprise a flash memory device, such as a universal serial bus (USB) drive. Storage device 125 may also store other files and information, such as the operating system for computer system 100.

While not shown in FIG. 1, alternative embodiments of a computing device in a system may connect to other computers of the system using a variety of different hardware. For example, computing system 100 may comprise a CAD workstation computer connected to another computer via a wireless communications card, or an Ethernet cable coupled to a local or wide area network (LAN or WAN). The desktop computer may, e.g., download and import cell files and/or 1×N building blocks from the Internet.

In one or more alternative embodiments, computing system 100 may also work with one or more other networked computing devices to perform one or more of the different design activities. For example, in one embodiment computing system 100 may edit and compile 1×N building blocks and generate a schematic view for the IC design. However, during the synthesis, physical design, or timing analysis stages, VLSI design application 145 may transfer netlist 185 for the design to the networked computer(s). Such an arrangement may be desired, for example, where the design task requires extensive computational power that may otherwise overload computing system 100. As the above example illustrates, various embodiments of a system may comprise an almost limitless number of wired and wireless communication devices, allowing computing devices of a system to communicate with each other to share and/or process VLSI design files, wherein the computers may be located close to or remote from each other.

As described earlier, VLSI design application 145 may work with 1×N building blocks 155. 1×N building blocks 155 may comprise the means by which physical implementation details of circuit elements in 1×N building blocks 155 are stored. A building block of 1×N building blocks 155 may provide a layer of abstraction between the logical behavior of the block and the physical realization of the corresponding logic elements. In numerous embodiments, 1×N building blocks 155 may comprise one or more user-configurable text files. In alternative embodiments, the building blocks may be represented in an alternative file format. For example, the building blocks may be stored in a proprietary binary file that is encoded and decoded as a circuit designer views/edits the 1×N building blocks.

1×N compiler 160 may perform a variety of tasks in VLSI design application 145. 1×N compiler 160 may comprise a software module or other type of module that, at a high level of abstraction, converts data from the building blocks of 1×N building blocks 155 into behavioral, physical, and logical representations, or definitions. 1×N compiler 160 may convert 1×N building blocks 155 into specifically formatted implementations as required by the different design phases. For example, conversions of 1×N building blocks 155 may be represented by 1×N compilation 260 in FIG. 2. During 1×N compilation 260, 1×N compiler 160 may take 1×N building blocks 155 generated by physical design 240 and reformat 1×N building blocks 155 into a form compatible with logic stage 220, without losing physical information that may have been generated in previous design iterations. Similarly, during 1×N compilation 260, 1×N compiler 160 may take 1×N building blocks 155 generated by logic phase 220, synthesis phase 230, or timing phase 250 and reformat 1×N building blocks 155 into a form or forms compatible with each of the phases, without losing physical, behavioral, or logical information that may have been generated in previous design iterations.

Figure 3:
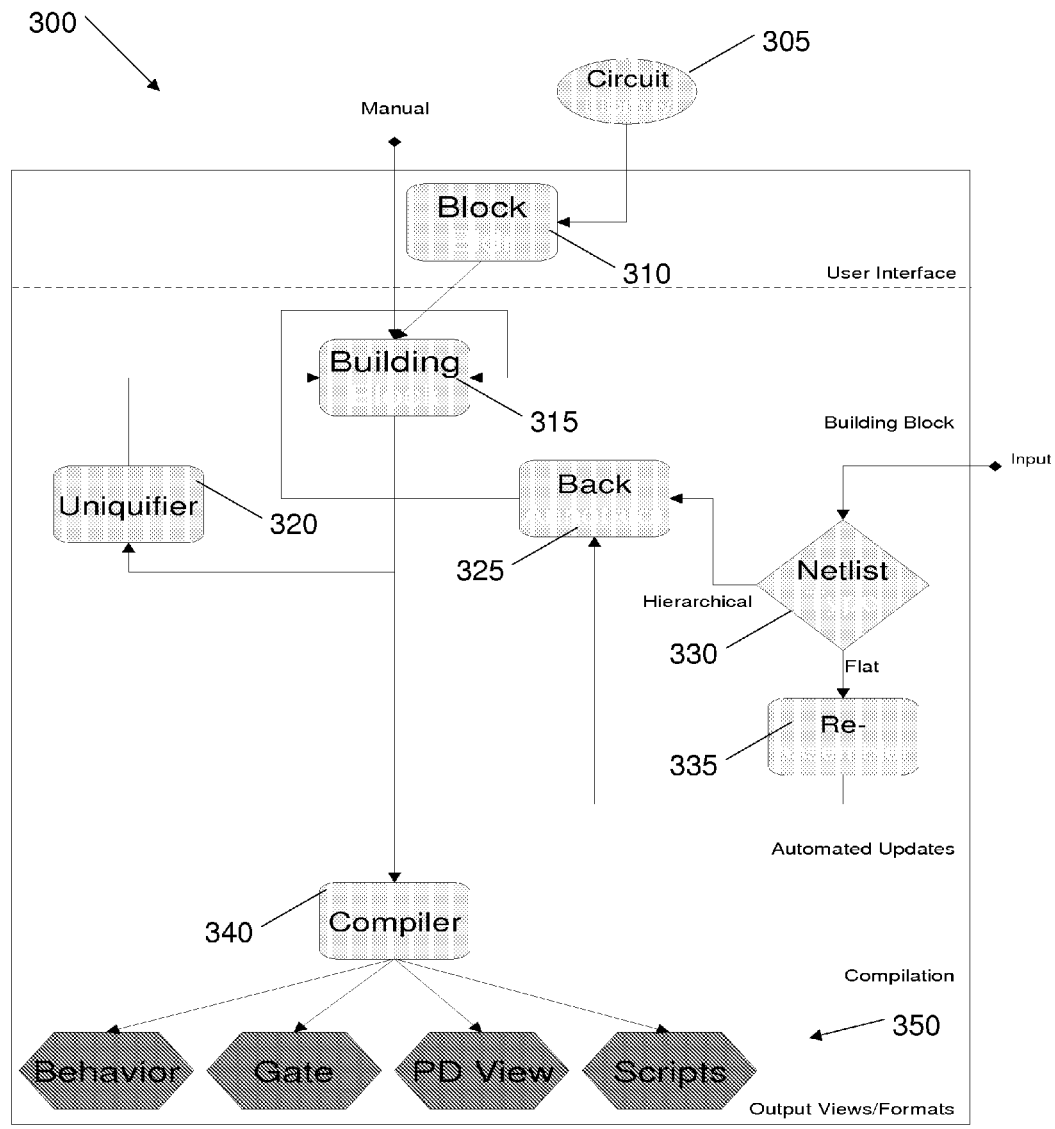
FIG. 3 illustrates design flow for a 1×N compilation for one or more embodiments.

FIG. 3 depicts a flowchart 300 that illustrates a design flow of a 1×N compilation for one or more embodiments. FIG. 3 illustrates how a circuit designer may use a 1×N block builder 310 to retrieve and edit one or more building blocks from a circuit library 305. For example, 1×N building block 315 may comprise a specific instantiation of 1×N building blocks 155 retrieved from cell library 130 and loaded into 1×N block builder 150.

1×N block builder 310 may comprise a graphical user interface (GUI) routine that allows the circuit designer to create one or more building blocks and implement a desired logical function. For example, 1×N block builder 150 may allow the circuit designer to create a bank of NAND logic gates in a relatively easy and efficient manner without having to be familiar with the actual scripting language required by 1×N compiler 160.

In various embodiments, 1×N block builder 310 may comprise the initial entry point to the 1×N compilation stage, which may correspond to 1×N compilation 260 shown in FIG. 2. 1×N block builder 310 may provide a layer of abstraction between the complexity of the physical elements comprising 1×N building block 315 and the associated logical representation. 1×N block builder 310 may check design requirements for each logical function and generate or create 1×N building block 315 that provides the proper gate constructs. 1×N block builder 310 may check the design requirements and create 1×N building block 315 without requiring the circuit designer to intervene or potentially even understand the design requirements.

Figure 5:
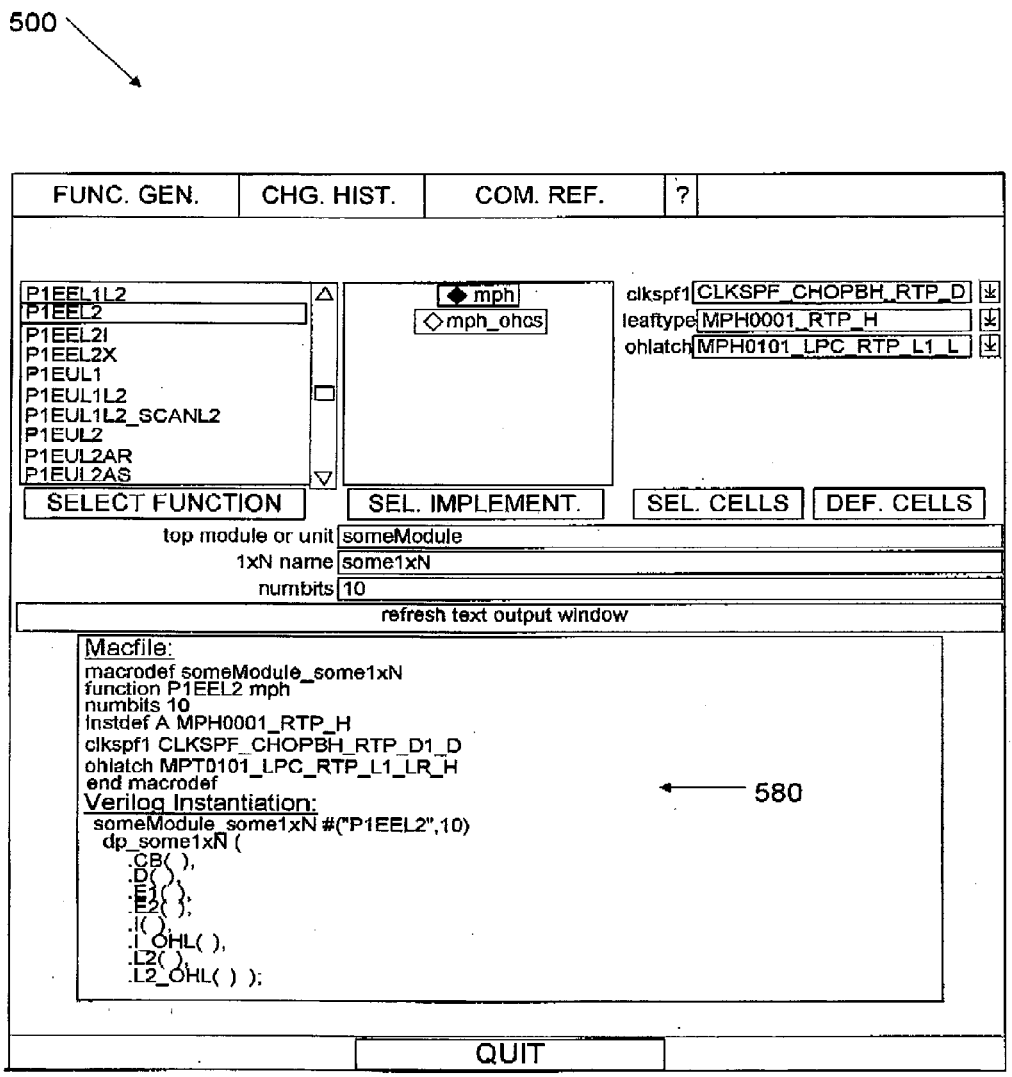
FIG. 5 shows a graphical user interface window that a designer may use when creating or modifying 1×N building blocks.

While 1×N block builder 310 may generate a default set of implementation details, the designer may be able to choose between specific implementation types and make specific customizations for 1×N building block 315, such as specific drive-strengths, Vt-hybridizations, bit widths, and/or voltage island references. Once the designer has chosen a desired 1×N building block 315 to build, 1×N block builder 310 may generate a logical RTL instantiation for 1×N building block 315, as well as the physically crafted realization of 1×N building block 315. One embodiment of a window for block builder 310 is depicted in FIG. 5. For example, 1×N block builder 150 may generate window 500 on display 110 when a circuit designer edits a specific building block, such as illustrative 1×N building block 600 depicted in FIG. 6A.

Figure 6A:
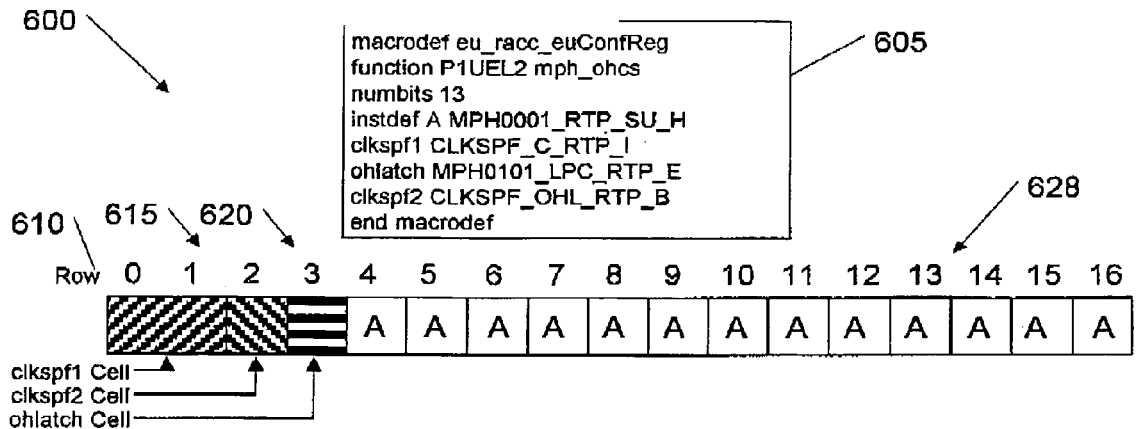
FIGS. 6A&6B show different configurations of a 1×N building block.

As FIG. 6A illustrates, 1×N building blocks may include a physical tiling methodology to create a row 610 of duplicate or similar cells, one or more overhead or support cells, as well as associated interconnectivity that matches the logic specification for the cells. For example, one 1×N building block may comprise a number of NAND gates, various parameters for one or more of the individual gates, two support cells, and some interconnection data. Another 1×N building block may comprise a row of multiplexers and support cells. As one skilled in the art will realize, the type of common cell for a 1×N building block, as well as the number of support cells and parameters, may vary greatly from building block to building block. The examples cited above and elsewhere in the specification are only a few examples cited for the sake of illustration. One should not interpret that 1×N building blocks are limited to the cited configurations. On the contrary, the different configurations or arrangements of cells and parameters for different 1×N building blocks are innumerable.

1×N building blocks like 1×N building block 600 may enable a VLSI design application to perform numerous transformations, or modifications, to elements and/or cells in the building blocks during the design process. The VLSI design application or a designer may invoke timing optimizations and/or power optimizations, either directly through synthesis refinement or manually via engineering change (EC) mode. The designer or VLSI design application may change predefined 1×N building blocks. For example, the designer may transform such parameters as polarity, drive strength, and hybrid-Vt for 1×N building blocks, thereby creating custom 1×N building blocks.

Using a 1×N building block methodology to design a VLSI circuit may create a framework that allows 1×N building blocks to be utilized in different ways. For example, in some embodiments, 1×N building blocks may be configured for use with industry-standard formats. In some embodiments, 1×N building blocks may be configured to use alternative, special, or proprietary features. As will be illustrated, the 1×N building block methodology may incorporate the ability to re-form hierarchy from a previously flattened hierarchical design, allowing optimization tools that work on flat data to nonetheless enable use of 1×N building blocks.

FIG. 6A depicts what may comprise a fully-realizable 1×N building block 600 in an embodiment. 1×N building block 600 may comprise a single-port, non-inverting latch bank with clock enable based on designer input from 1×N block builder 3 10. Alternatively, 1×N building block 600 may comprise a default implementation of a 1×N building block. FIG. 6A shows a single latch type (A) arranged in rows 4-16 (element 628) with two clock splitters (element 615) arranged in rows 0-1 and 2, and an overhead latch (element 620) in row 3. FIG. 6A also depicts the associated logical RTL 605 generated by the 1×N block builder for 1×N building block 600. Worth noting, FIG. 6A shows the elements of 1×N building block 600 arranged in a row, horizontally. As one skilled in the art will appreciate, the arrangement of the elements of 1×N building block 600, or other 1×N building blocks, does not have to be in a row, or horizontally situated. For example, the elements may instead be located in a different manner, such as in a column, running vertically from top-to-bottom or bottom-to-top.

Figure 6B:
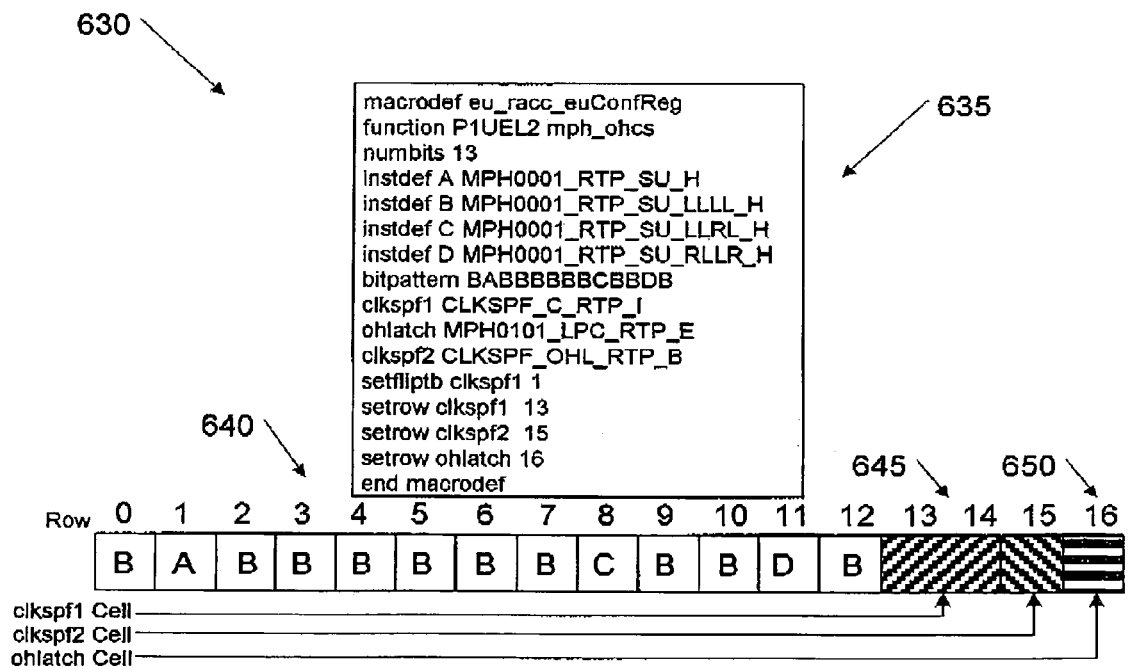

FIG. 6B illustrates another 1×N building block 630 with specifically-tuned implementation details for 1×N building block 600 described in FIG. 6A. In other words, 1×N building block 630 may comprise a customized version of 1×N building block 600. 1×N building block 630 has four different Vt-hybridization choices 635, represented by "instdef A" through "instdef D", for the latch bits of 1×N building block 630. FIG. 6B also illustrates the physical placement data 640 for each cell in 1×N building block 630. In FIG. 6B, the latch bits are arranged in rows 0-12 with each Vt-hybridization choice represented by a different letter. The two clock splitters 645 are arranged in rows 13-15 with the overhead latch 650 arranged at the end in row 16.

1×N building blocks 600 and 630 are exemplary building blocks, none of which may be required in any specific embodiment. 1×N building blocks 600 and 630 may be the results of individual optimizations through each design phase in order to meet power, area, and timing goals for one particular latch bank and the associated timing paths for the latch bank. Various integrated circuit parameters may vary with factors such as temperature, voltage and frequency. One circuit parameter that a circuit designer may adjust is the drive strength of one or more circuit devices, such as an output driver stage. For example, the circuit designer may match the output drive strength of a signal to the circuit being driven. Another parameter that a circuit designer may adjust is Vt-hybridization. Vt-hybridization refers to an optimization technique for static power reduction while optimizing performance within a given drive strength. Worth emphasizing, in many embodiments the polarity of individual bits of a 1×N building block may also be modified by optimization routines. Additionally, the polarity of individual bits may be manually modified.

Returning back to FIG. 3, uniquifier 320 may comprise a software module or other type of module that permits individual building blocks 315, which may correspond to individual building blocks of 1×N building blocks 155 of FIG. 1, to be reused within a design. When a designer decides to reuse a 1×N building block, at a particular step in the design phase, the designer may designate a parent definition and a number of child definitions for that 1×N building block. In other words, uniquifier 320 may create a type of software inheritance, wherein each child definition may inherit the properties of the related parent definition, unless the inheritance is overridden. For example, uniquifier 165 may work in conjunction with 1×N compiler 160 during the 1×N compilation stage, read a netlist 185, read the current set of building blocks of 1×N building blocks 155, and determine whether any building blocks are reused. If any building blocks are reused, uniquifier 165 may create parent-child definitions where such definitions do not already exist and produce a new netlist 185 with unique names for each child that directly corresponds to the child definitions created with the building block definitions. Parent-child relationships and uniquification are illustrated in greater detail in FIGS. 7A, 7B, and 7C.

In some embodiments, uniquifier 320 may also be configured to selectively ignore or uniquify specific sets of 1×N building blocks 315. Selective uniquification of building blocks may be advantageous in situations where parent-child relationships do not need to be defined during the logic entry stage, which may correspond to logic phase 220. The parent-child relationships may be defined on-the-fly as the relationships are required for a design stage. Depending on the embodiment, uniquifier 320 may be configured to read netlist 330 in a mixture of different formats. For an example referring to FIG. 1 and FIG. 2, uniquifier 165 may read netlist 185 formatted in one format generated in physical design phase 240, yet also read a modified version of netlist 185 formatted in a second format generated after tuning from timing phase 250.

During the various iterations of a design, 1×N compiler 340 may generate compilation data for a number of different views 350. The different views of views 350, which may correspond to output view data 180 depicted in FIG. 1, may comprise behavioral representations, gate-level or logical representations, physical design representations, and an output view for various types of scripts.

1×N compiler 340 may generate compilation data for behavioral RTL as well as gate-level RTL. Additionally, 1×N compiler 160 may generate compilation data for physical views, helper scripts, and potentially numerous other views depending on the embodiment. For example, VLSI design application 145 may use 1×N compiler 160 to generate Verilog HDL behavioral RTL and corresponding Cadence™ physical views. Additionally, in numerous embodiments, 1×N compiler 160 may be configured based on the tool suite of the user, such as tools 190. In other words, an embodiment may control which languages and view types are generated. An alternative embodiment may generate VHDL behavioral RTL and corresponding Synopsys® physical views.

Iterative Logic Cycle

To illustrate in more detail the iterative logic, synthesis, physical design, and timing cycles for 1×N building blocks, we turn now to FIGS. 4A-4D. For the sake of illustrative context, logic phase 410 and 1×N compilation 402 of FIG. 4A may correspond to logic phase 220 and 1×N compilation 260 shown in FIG. 2, respectively. The closed loop may comprise the design flow from logic stage 220 to 1×N compilation 260, via the secondary/dashed flow line, and back from 1×N compilation 260 to logic stage 220, via the solid/primary flow line. Additionally, 1×N building block 404 and 1×N compiler 406 may correspond to 1×N building block 315 and 1×N compiler 340, respectively, of FIG. 3.

Figure 4A:
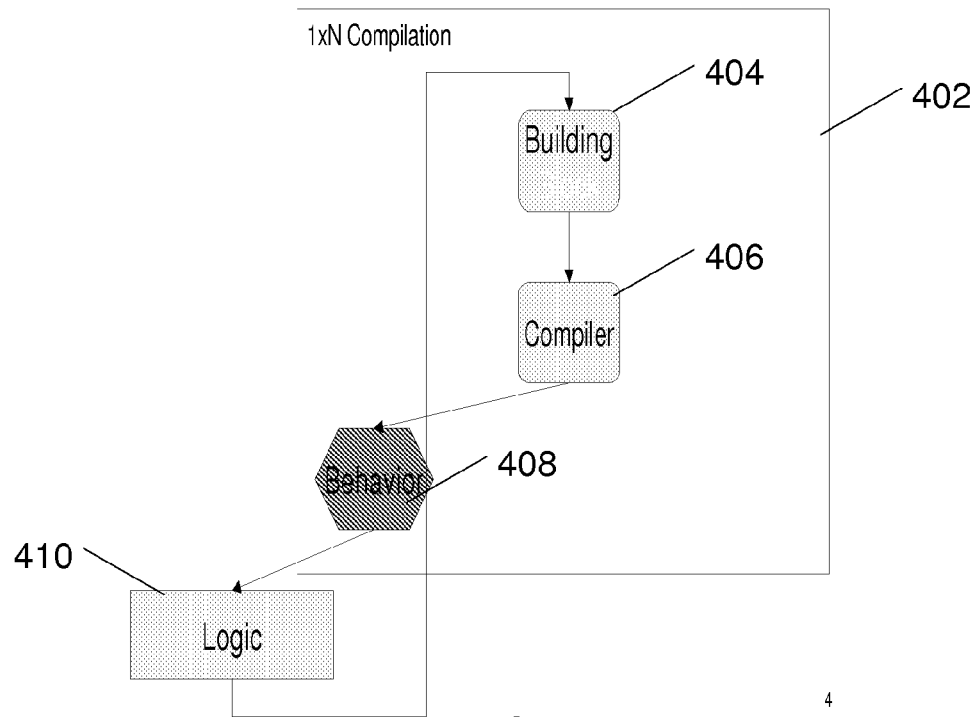
FIG. 4A illustrates one embodiment of a closed loop cycle between the elements of 1×N compilation and a logic phase.

FIG. 4A illustrates one embodiment of a closed loop cycle between the elements of 1×N compilation 402 and logic phase 410. For example, during a design of an integrated circuit, a circuit designer may have created the behavioral RTL, synthesized the RTL and converted the design from a behavioral script form to a physical design form, and tuned or optimized the flattened form of the physical design to meet certain performance requirements. The circuit designer may then take the flattened physical design altered during a timing analysis and view/modify the behavioral definition of the design at logic phase 410. In other words, the designer may generate a behavioral view 408 from the flattened physical design via 1×N compilation 402. Behavioral view 408 may comprise, e.g., a VHDL listing for the design. Worth pointing out, the entry point into 1×N compilation 402 to generate behavioral view 408 may be from one of the other stages, not just logic stage 410 as depicted in FIG. 4A. As described in the example, the entry point into 1×N compilation 402 was from the timing stage, such as from timing phase 250 as illustrated in FIG. 2.

The iterative logic cycle depicted in FIG. 4A may enable more liberal logic reuse by increasing the level of abstraction for the gate-level design by using 1×N building blocks, such as 1×N building block 404. The use of 1×N building blocks may enable the increase of logic reuse as a result of decoupling the gate-level implementation of a 1×N building block from its logical function via the use of the 1×N compiler. To illustrate the increase of abstraction and the decoupling of the gate-level implementation from the logical function, we may briefly examine FIG. 5. As shown in FIG. 5, an RTL instantiation of a 1×N building block may include parameterized calls 580 that describe features of 1×N building blocks. For example, the 1×N building block features may include a logical function type and a number of bits for the 1×N building block. Logical function types and numbers of bits are just example features; other features may be available in various alternative embodiments.

1×N compiler 406 may insert checks, or verification text, in the 1×N behavioral RTL model for the parameterized features. When the design is simulated via an RTL simulation tool, the verification text may ensure that the intent of the designer, which is described in the RTL, matches the gate-level implementation defined by the 1×N behavioral model. One should note that the behavioral model for a 1×N building block may not need to be gate-specific. As a behavioral model, the model may describe the logical function using higher-level constructs. The higher-level constructs may be defined by the RTL language used. For example, the higher-level constructs for System Verilog may be different than the higher-level constructs for VHDL.

1×N compiler 406 may verify that the behavioral model, which may be represented by behavioral view 408, and the gate-level implementation are equivalent. For example, in one embodiment 1×N compiler 406 may verify that the behavioral model and the gate-level implementation are equivalent by using one or more verification tools. The verification tools may be, e.g., industry standard verification tools available in IC design systems available from Cadence™, Synopsys®, Mentor Graphics®, Magma®, or other design systems. Verifying the equivalency of the behavioral model and the gate-level implementation may help protect the designer from inadvertent changes during the logic design, as well as protect the designer from gate-level changes that might alter a function of a 1×N building block.

The behavioral model construct generated by 1×N compiler 406 may allow the circuit designer to reuse 1×N building block 404 and related logical function(s) in the design without having to worry about the gate-level tweaks that may be necessary for proper placement or timing of the specific 1×N building block. Consequently, using the generated behavioral model may also help protect the intellectual property described in the gate-level netlist because the gate-level details are not directly disclosed by the RTL listing. In other words, a hardened or physically-realized design that uses this 1×N building block methodology may be converted to a softened, or RTL-level, design and transferred to another party with less risk of exposing physical details, which may be sensitive or proprietary in nature. Generating an RTL-level design from a physically-realized design may not necessarily be limited to 1×N building blocks. 1×N compiler 406 may generate an RTL-level design from other types of hierarchical RTL elements. In other words, the 1×N methodology described herein may provide an automated closed-loop approach that may used to create RTL-level or behavioral-level design for numerous other RTL elements.

Iterative Synthesis Cycle

Figure 4B:
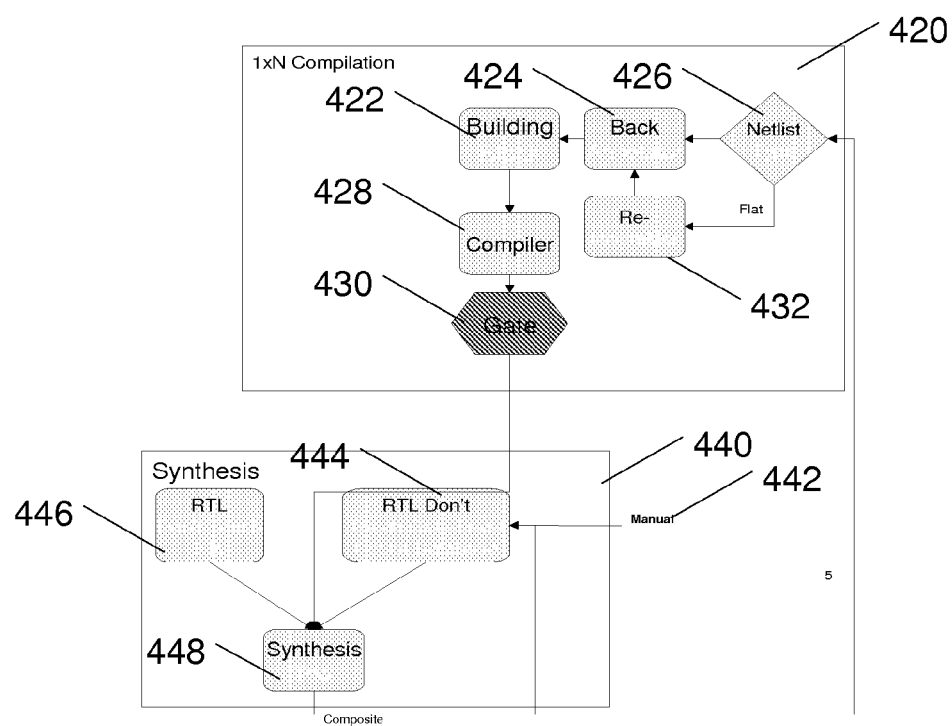
FIG. 4B illustrates one embodiment of a closed loop cycle between the elements of 1×N compilation and a synthesis phase.

To illustrate in more detail the iterative synthesis cycle, we move to FIG. 4B. Synthesis phase 440 and 1×N compilation 420 of FIG. 4B may correspond to synthesis phase 230 and 1×N compilation 260, respectively, shown in FIG. 2. The closed loop may comprise the design flow from synthesis phase 230 to 1×N compilation 260, via the secondary/dashed flow line exiting synthesis phase 230, and back from 1×N compilation 260 to synthesis phase 230, via the secondary/dashed flow line between the two. Additionally, internal elements of 1×N compilation 420 may correspond to the respective elements depicted in flowchart 300 for FIG. 3.

FIG. 4B illustrates one embodiment of a closed loop cycle between the elements of 1×N compilation 420 and synthesis phase 440. Synthesis phase 440 may comprise a stage in the design process where a design application like VLSI design application 145 may employ a substantial number of automated optimization techniques. In the classical design methodology, many of the updates created by the automated optimization tools are discarded prior to logic-freeze, because the physical information for these updates is not translated back to the RTL. To help prevent the loss of one or more of the optimization updates, the 1×N design methodology may provide an "RTL no-touch" feature.

The RTL no-touch feature may comprise a software routine of a VLSI design application. For example, RTL no-touch software may comprise a set of instructions that guides a synthesis engine, such as synthesis tool 448, preventing the engine from synthesizing a set of RTL statements. Preventing the synthesis engine from synthesizing a set of RTL statements may be helpful when the RTL for a specific section of a design has already been optimized. For example, the RTL for two sections of a design may have been optimized by some tool or by human intervention. The designer may want the two sections to remain unaltered in subsequent iterations of the synthesis engine. One may contrast the RTL no-touch feature with conventional approaches, where the synthesis engine of the conventional approaches would integrate the gate-level entities within the RTL, alter the generic nature of the RTL, and make the design technology dependent.

Various embodiments may provide an RTL no-touch feature by allowing specific sets of RTL constructs to be designated as having been previously implemented and optimized as gate-level netlists. For example, a circuit design may have twenty-five different 1×N building blocks. A circuit designer may have synthesized the circuit and tuned a portion of the circuit having ten 1×N building blocks. The circuit designer may want to add some additional circuit functions, or otherwise modify the circuit design at the behavioral level, using Verilog HDL. The circuit designer may designate the ten 1×N building blocks that have been tuned as no-touch blocks. As a consequence, any subsequent automated optimizations performed on the circuit design may tune or alter the other fifteen 1×N building blocks and the newly added circuit functions but make no more tuning or optimization changes to the ten previously tuned building blocks.

Various embodiments may implement the RTL no-touch feature by maintaining the gate-level netlists for the no-touch building blocks (element 444) separate from the behavioral level design. The embodiments may maintain separate gate-level netlists and behavioral lists to the building blocks as long as both the gate-level netlists and behavioral lists are proven and maintained to be logically equivalent, such as by using industry-available tools. The RTL no-touch feature may not be limited to 1×N building blocks. Many embodiments may implement the RTL no-touch feature for both 1×N building blocks and other types of hierarchical cells and circuit elements in a circuit design. Using the RTL no-touch feature for other types of circuit elements may allow a designer to tune one or more parts of a circuit design, which may contain both 1×N building blocks and non-1×N elements, and prevent such tuning parameters from being erased or overwritten during subsequent tuning or optimization for other portions of the circuit design. Referring to FIG. 2, the designer may designate numerous elements as no-touch elements in synthesis phase 230, wherein the no-touch elements may remain unaltered in subsequent iterations of logic phase 220, synthesis phase 230, physical design phase 240, timing phase 250, and 1×N compilation 260.

In at least one embodiment, the RTL no-touch feature may eliminate the need for disrupting the RTL-only design environment with gate-level implementation details. The 1×N compiler may be configured to avoid generating RTL-level code for the no-touch building blocks. Preventing the generation of the RTL-level code may enable the embodiment to help protect proprietary design techniques, as well as maintain a technology-independent netlist.

FIG. 4B illustrates an iterative synthesis cycle with the technique of RTL no-touch. FIG. 4B also illustrates a back-annotation flow that will be described in the discussions which follow. Three distinct inputs may be fed into synthesis tool 448, as shown in FIG. 4B. One input may feed from the overall behavioral RTL (element 430). A second input may feed from an RTL no-touch file (element 446). A third input may feed from an RTL no-touch gate-level netlist database (element 444).

Each netlist in the RTL no-touch gate-level netlist database (element 444) may have a one-to-one correspondence to a corresponding element in the behavioral RTL (element 430). The RTL no-touch gate-level netlist database (element 444) may be constructed by selective output extraction of synthesis tool 448, manual intervention (element 442), or another type of automated means. The RTL no-touch file (element 446) may designate which behavioral RTL constructs (element 430) should be replaced by the gate-level netlist counterparts. Further, the RTL no-touch file (element 446) may also specify that synthesis tool 448 should avoid further manipulation of the replaced gate-level netlist counterparts. Avoiding further manipulation of the replaced gate-level netlist counterparts may be beneficial, because the synthesis tool 448 may optimize the other gate-level constructs for better overall design performance without disturbing the previously optimized netlists. Synthesis tool 448 may then generate or create the composite design netlist (element 426), which may include the RTL no-touch gate-level constructs.

Back-annotation

By employing a 1×N design methodology, an IC design application like VLSI design application 145 may maintain the results of optimizations performed on 1×N building blocks through a process of back-annotation. With back-annotation, a circuit designer may also perform automated optimizations of the design. In many embodiments, the circuit designer may perform the automated optimizations normally, such as the designer would in a traditional design flow. Performing the automated optimizations in a traditional manner may allow a system employing 1×N building blocks to decouple the 1×N building blocks from the tool-suite of the system. Referring back to FIG. 1, computing system 100 may perform automated optimizations on an IC design, such as a design represented by netlist 185, via tools 190 yet VLSI design application 145 may decouple 1×N building blocks 155 from tools 190.

A premise of back-annotation may be the detection and description of optimizations via 1×N building blocks. An embodiment may perform an optimization on a design and make changes to the netlist based on the optimization results. The back-annotation feature may allow the embodiment to detect the netlist changes and then describe or create updates to the 1×N building blocks corresponding to the netlist changes. FIG. 4B illustrates back-annotation via back-annotator 424. Back-annotator 424 may comprise, e.g., a software module in the stage of 1×N compilation 420, back-annotator 325 depicted in flowchart 300, or back-annotator 170 of VLSI design application 145 shown in FIG. 1.

Back-annotator 424 may read two netlists. In FIG. 4B, back-annotator 424 may read a hierarchical netlist from netlist 426 created before one or more optimization operations. Back-annotator 424 may also read a netlist that has been modified, tuned, or updated via an optimization tool or a synthesis tool. For example, back-annotator 424 may read a netlist from synthesis tool 448. Back-annotator 424 may find the 1×N building blocks in the different netlists and then detect changes of the 1×N building blocks. If back-annotator 424 finds any changes, such as by a comparison process, back-annotator 424 may update the appropriate 1×N building block 422 to reflect those optimizations. For example, back-annotator 424 may detect a change in the different netlists and update the affected parents and/or children 1×N building blocks. Back annotator 424 may detect changes such as drive-strength alterations, Vt-hybridization changes, placement modifications, voltage island changes, bit width changes, cell-type changes, as well as other types of changes.

Since the optimizations made to the elements in the netlists are decoupled from the 1×N building blocks, back annotation for 1×N building blocks may allow an embodiment to support numerous optimization techniques, such as optimization techniques for timing, power, or area. Additionally, an embodiment may have the capability to disable one or more optimization tools or optimization features via synthesis tool 448 or back annotator 424. The quality of the starting netlist or "seed" may determine the output quality and amount of time required for automated optimization routines. Consequently, the use of iterative cycles of synthesis and back annotation may improve runtimes and result in better-optimized designs.

Back-annotator 424 may be extendable and programmed to selectively accept or ignore a specified set of changes to a specific list of 1×N building blocks. An embodiment may program back-annotator 424 to selectively accept or ignore the specified set of changes through a list of directives, which may be similar to the use of directives by existing synthesis tools. For example, if an embodiment needs a specific 1×N bit-ordering to meet a routing requirement, the embodiment may disable placement updates by fixing cell locations in the netlist or by providing back-annotator 424 with a list of 1×N building blocks for which the placement updates should be ignored. Further, depending on the embodiment, the user may be able to select the method used for optimization-exclusion. If the tool suite in an embodiment supports optimization-exclusion, the embodiment may allow a user to configure the optimization-exclusion via synthesis tool 448. However, in another embodiment that does not support optimization-exclusion, or if the optimization-exclusion is difficult or cumbersome to use, the embodiment may allow the user to configure the optimization-exclusions via back-annotator 424.

In many embodiments, synthesis tool 448 may be hierarchy-aware. In other words, synthesis tool 448 may be configured to recognize and work with hierarchical cell elements. For embodiments that have a hierarchy-aware synthesis tool 448, 1×N building block 422 may be represented as hierarchical elements, e.g., traditional hierarchical elements. Synthesis tool 448 may manipulate the hierarchical elements to produce an optimized design. For embodiments that have hierarchy-aware synthesis tool 448, the embodiments may need to perform the timing improvements or timing optimizations using the individual gates within the hierarchical elements so that timing rules such as New Delay Rules (NDRs) are not required for each individual 1×N building block 422. Otherwise, an embodiment may need to update 1×N compiler 428 to generate NDRs for each 1×N building block 422.

In many embodiments, optimizations made to 1×N building blocks may be captured via back-annotation by back-annotator 424. Placement changes allowed on a hierarchical 1×N building block 422 may be used in the physical design phase for floorplanning updates. Because the results of synthesis and automated optimization routines may largely depend on the initial quality of the netlist, or starting seed, maintaining optimizations for 1×N building blocks through back-annotation may result in a better quality synthesis result through successive iterations.

Reassembly

As illustrated above for embodiments that do not have hierarchy-aware tools, the embodiments may flatten the 1×N building blocks before performing the optimizations. Embodiments that flatten the 1×N building blocks before performing the optimizations may detect and capture changes to the 1×N building blocks via back-annotation. However, flattening the design may eliminate the hierarchy established to maintain 1×N building blocks as individually tunable elements in the separate design phases. To address the eliminated hierarchy, various embodiments may recreate the hierarchy through a reassembly process.

Reassembler 432 may comprise a software module or other type of module for 1×N compilation 420 that uses netlist attributes created by 1×N compiler 428 to recreate the hierarchical design. Reassembler 432 may also comprise, e.g., reassembler 335 depicted in flowchart 300, or reassembler 175 of VLSI design application 145 shown in FIG. 1.

Reassembler 432 may detect changes to 1×N building blocks, such as 1×N building block 422, via back-annotation. However, because the netlist may have been flattened, the changes may not be directly applied back to the hierarchical RTL and physical design netlists. Reassembler 432 may discern the hierarchical boundaries of the flattened netlist. Plus, reassembler 432 may be configured to apply the updates for the 1×N building block 422 back to the respective hierarchical physical design netlist or RTL netlist without manual intervention.

For example, reassembler 432 may use attributes created by 1×N compiler 428, which are present in the flattened netlist, to recreate the hierarchical design. The flow process for recreating the hierarchical design via attributes of the netlist is illustrated in FIG. 4B, with the determination of the type of netlist type 426 causing reassembler 432 to reassemble flattened netlist elements. If the netlist from synthesis tool 448 is a hierarchical or non-flattened netlist, back-annotator 424 may read the netlist directly, without any modifications. However, if the netlist has been flattened, such as due to the requirements of synthesis tool 448, back-annotator 424 may read a reassembled netlist from reassembler 432.

Parent-Child Relationships

In numerous situations for an embodiment, 1×N building blocks may be considered as singular entities with corresponding physical views. For example, FIG. 6A depicts 1×N building block 600 that comprises a single latch bank. Considering 1×N building blocks as singular entities may allow for individual tuning of 1×N building blocks in the logic phase, synthesis phase, or physical design phase, as long as a circuit designer does not reuse the 1×N building blocks. However, in numerous embodiments, a 1×N design system may support the reuse of 1×N building blocks. Supporting the reuse of 1×N building blocks may enable increased efficiency in the different phases of a design process. For example, a circuit designer may wish to create a specific instance of a 1×N building block. To speed completion of the design, the circuit designer may use several instances of the 1×N building block in various parts of the circuit design, with one or more of the instances being tuned differently than the others. Numerous embodiments may enable such reuse of 1×N building blocks by creating parent-child relationships for the 1×N building blocks. Further, many embodiments may automate the creation of the parent-child relationships via a uniquification process in during 1×N compilation to generate the logical and physical design representations, and in some embodiments the behavioral representations as well.

Figure 7A:
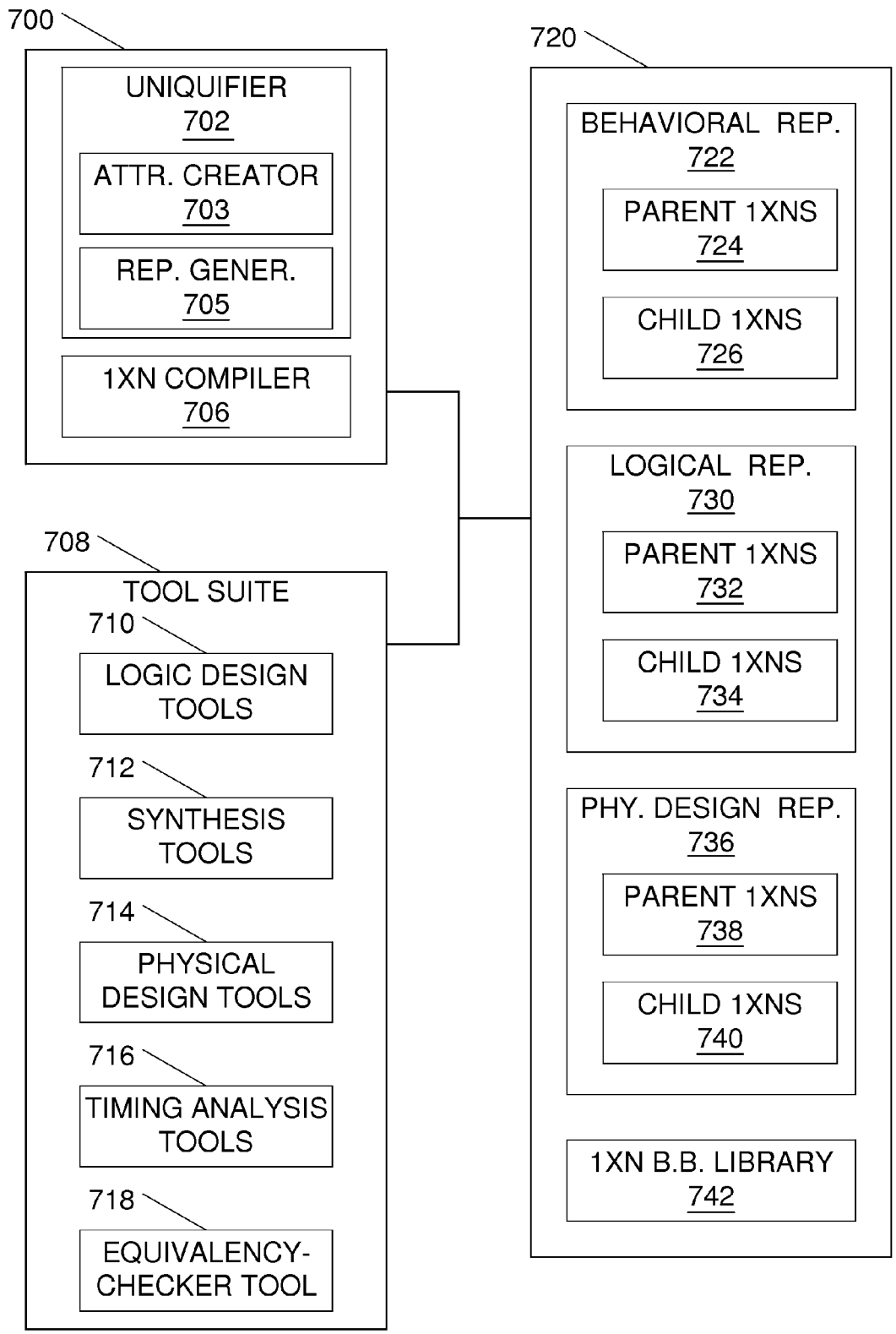
FIG. 7A depicts an apparatus that may create parent-child relationships for reuse of 1×N building blocks in a closed-loop 1×N system.

FIG. 7A depicts an apparatus 700 that may create parent-child relationships in a closed-loop 1×N system. For example, an integrated circuit designer may use apparatus 700 when creating parent-child relationships for behavioral representation 722, logical representation 730, and/or physical design representation 736. Each representation may comprise a portion of a circuit design file 720. For example, circuit design file 720 may comprise netlist 185 and/or design file(s) 135 shown in FIG. 1. In one or more embodiments, apparatus 700 may be part of a VLSI design application, such as VLSI design application 145. In alternative embodiments, apparatus 700 may comprise a device used to create parent-child relationships for different representations, such as a state machine arranged to create parent-child relationships for logical and physical design representations of circuit design file 720.

The circuit designer may desire to reuse a 1×N building block during various design phases, such as during logic phase 220, synthesis phase 230, physical design phase 240, or timing analysis phase 250 shown in FIG. 2. The circuit designer may designate a parent 1×N building block and a number of child 1×N building blocks that correspond to the parent 1×N building block. For example, during a synthesis phase, the circuit designer may designate six instances of child 1×N building blocks 734 that correspond to a specific parent building block of parent 1×N building blocks 732 in logical representation 730.

Designating a number of child 1×N building blocks for a parent 1×N building block may, for the sake of understanding, be compared with the concept of software inheritance, in that each child 1×N building block may inherit certain attributes of the associated parent 1×N building block. However, the circuit designer or a tool of a tool suite may be able to override one or more of the inherited attributes of the child 1×N building block. Overriding one or more of the inherited attributes may be accomplished in multiple ways. For example, the circuit designer or the tool may insert additional lines of text in the definition file of the child 1×N building block that designate which attributes equal those of the parent and which are unique to each individual child, as illustrated in FIG. 7B.

FIG. 7B depicts a parent 1×N building block 752, that has three child 1×N building blocks 760, 770, and 780. Parent 1×N building block 752 has a name attribute of "SomeParent", arranged to perform a particular function "someFunc" via a first attribute definition (A) of "cellType1", with a number of bits attribute 753 equal to one. Child 1×N building blocks 760 and 770 may inherit the attributes of parent 1×N building block 752, unless the inherited attributes are overridden, and may also include additional functions or attributes. For example, child 1×N building block 760 is defined to be a child of parent 1×N building block 752 via a "childof" attribute 765, and has a number of bits attribute (element 764) equal to 5, having a bit pattern attribute 767 arranged in a physical manner described by arrangement 776. Child 1×N building block 760 includes an additional attribute (B) of "cellType2" (element 766). As FIG. 7B illustrates, child 1×N building block 760 inherits the parent attribute of "cellType1", since the attribute or property was not overridden. Additionally, child 1×N building block 760 overrode the number of bits attribute 753 with five bits (element 764). Contrasting child 1×N building block 770 with child 1×N building block 760, child 1×N building block 770 does not include any additional attributes but overrides the number of bits attribute 753 with six bits (element 772). As FIG. 7B illustrates, the number of bits of a parent 1×N building block may differ from the number of bits of a corresponding child 1×N building block. Additionally, different child 1×N building blocks may have different numbers of bits from each other, even though the 1×N child building blocks have a common parent.

FIG. 7B also illustrates how child 1×N building block 780 may be a child of child 1×N building block 760, via "childof" attribute 782, and inherits the attributes of child 1×N building block 760 unless specifically overridden. For example, 1×N building block 780 inherits the first attribute (A) of "cellType1", which child 1×N building block 760 inherited from parent 1×N building block 752, and inherits attribute (B) of "cellType2" (element 766) from child 1×N building block 760. However, child 1×N building block 780 overrides the bit pattern attribute 767 with bit pattern attribute 784, with corresponding physical arrangement 786. Worth noting, the 1×N building blocks of FIG. 7B do not include any auxiliary or support/overhead bits, such as the overhead bits illustrated in FIGS. 6A and 6B, for the sake of illustration. Parent-child 1×N building blocks in various embodiments may include such auxiliary bits or elements.

Inserting additional lines of text to override inherited attributes may be advantageous to a circuit designer during the physical design phase and/or the timing analysis phase. During the physical design and timing analysis phases, the circuit designer and/or a tool may need to make changes to one or more of the representations, such as changing drive strengths or adding instances of reused 1×N building blocks. Without employing a parent-child relationship, any change made to one specific 1×N building block in a library like 1×N building block library 742 may otherwise be applied to all instantiations of the specific 1×N building block. For example, if the circuit designer were to recompile behavioral representation 722, logical representation 730, and/or physical design representation 736 without differentiating which instances of the 1×N building block should change and which instances of the 1×N building block should not change, 1×N compiler 706 may change all instances of the specific 1×N building block.

The parent-child relationship, created via attributes, may differ from software inheritance due to the functional equivalency for the parent and associated children. 1×N compiler 706 may check functional equivalency of child blocks through calls to various types of tools, such as commercially available equivalence-checkers. Various embodiments may check the functional or logical equivalency via 1×N compiler 706, as checking the equivalency during compilation may allow the circuit designer to manually update the 1×N building blocks in a circuit design and recompile the building blocks at different phases of the design.

1×N compiler 706 may also take advantage of different tools, such as equivalence-checker tool 718, to allow for cloning and logical inversion of individual bits, or elements, of 1×N building blocks in logical representation 730, which may comprise a gate-level netlist. In other words, 1×N compiler 706 may provide a set of assertions to equivalence-checker tool 718 that may enable such optimizations without necessarily requiring the circuit designer to update the RTL of behavioral representation 722.

Enabling 1×N compiler 706 to provide the set of attributes to different tools may be accomplished, e.g., by adding one or more fields to the definition of a 1×N building block to specify which behavioral and gate-level leaf cells are equivalent, or inverted equivalent, to one another. 1×N compiler 706 may then use the one or more added fields to generate and check the appropriate 1×N building block representations, as well as the appropriate set of attributes for use in checking equivalence of the larger design.

Using external tools to check for logical equivalence may further decouple behavioral representation 722 from physical design representation 736. Further decoupling behavioral representation 722 from physical design representation 736 may provide greater protection of proprietary design techniques. Fields that may be added to the definitions of 1×N building blocks may include, e.g., gate-level implementation type, bit-wise mask of implementation type (behavioral or gate-level), and/or bit-wise mask of polarity relationship (inverted or non-inverted).

The representation forms of circuit design file 720 may vary from embodiment to embodiment, as well as within an embodiment. Behavioral representation 722 may comprise a high-level description of circuit design file 720. For example, behavioral representation 722 may comprise one or more types of HDL code, behavioral RTL descriptions, user-configurable text files, C-language code, RTL netlists, or other high-level elements that describe various circuit devices, including 1×N building blocks, cells, and/or hierarchical cells/macros. Parent-child definitions for behavioral representation 722 may comprise parent 1×N building blocks 724 and child 1×N building blocks 726.

Logical representation 730 may comprise a gate-level description of circuit design file 720. For example, logical representation 730 may describe an alternative form of circuit design file 720, having such components and/or elements as AND gates, OR gates, NAND gates, and NOR gates, as well as a mixture of 1×N building blocks and other high-level macrocell components, such as adders, arithmetic logic units, multiplexers, and register-files. Parent-child definitions for logical representation 730 may comprise parent 1×N building blocks 732 and child 1×N building blocks 734.

Physical design representation 736 may comprise a low-level description of circuit design file 720. For example, physical design representation 736 may describe an alternative form of circuit design file 720, having such components and/or elements as nodes, wires, resistors, capacitors, inductors, contacts, poly, diffusion, many of which may have associated placement and dimensional data. Depending on the embodiment, physical design representation 736 may also comprise hierarchical information, such as hierarchical information of cells and 1×N building blocks. For example, physical design representation 736 may comprise a PD netlist and/or a flattened netlist. Parent-child definitions for physical design representation 736 may comprise parent 1×N building blocks 738 and child 1×N building blocks 740.

During the design process, the circuit designer may have to repeatedly and iteratively use one or more of the tools of tool suite 708 before developing a final physical design representation 736 that may be fabricated. For example, the designer may use one or more logic design tools 710 that work in conjunction with 1×N compiler 706 to create parent 1×N building blocks 724 and child 1×N building blocks 726 in behavioral representation 722. Logic design tools 710 may comprise, e.g., cell editors, 1×N building block editors, RTL editors, and other high-level circuit design applications.

The designer may use one or more synthesis tools 712 to create logical representation 730 from behavioral representation 722. One or more of synthesis tools 712 may work in conjunction with 1×N compiler 706 when creating parent 1×N building blocks 732 and child 1×N building blocks 734 for logical representation 730. The designer may then analyze and/or optimize the design via one or more logic design tools 710. For example, the designer may simulate the operation of groups of elements, cells, and 1×N building blocks of logical representation 730, such as applying various sequences of bit patterns to verify that logical representation 730 behaves in a similar or equivalent fashion as behavioral representation 722 behaves. Additionally the designer may use one or more timing analysis tools 716 with logical design tools 710. For example, the designer may verify that signals propagate through sections of the circuit in required time intervals and that drive strengths are sufficient for implemented fan-outs.

The circuit designer may use physical design tools 714, which may work in conjunction with 1×N compiler 706, to convert logical representation 730 to physical design representation 736. Similar to the other iterative closed-loops encountered when generating behavioral representation 722 and logical representation 730, the designer may need to make numerous changes to elements of physical design representation 736 due to results of physical design tools 714 and timing analysis tools 716. For example, the designer may discover that a routing tool cannot create a functional wiring arrangement for the design, due to rule restrictions, area constraints, and other problems encountered by physical design tools 714. Alternatively, one or more optimization tools may alter elements of the design, such as by relocating elements, selecting different pins of different cells and/or 1×N building blocks, increasing gate drive strengths, rearranging cells of 1×N building blocks, and making other types of alterations to other elements of physical design representation 736. Consequently, the designer may use apparatus 700 and 1×N compiler 706 to generate updated representations of altered parent and child 1×N building blocks for the various representations of behavioral representation 722, logical representation 730, and physical design representation 736.

Uniquification

Embodiments may create child definitions in numerous ways. In a first way, an embodiment may create a child definition via manually editing of a 1×N building block. For example, the circuit designer may place a 1×N building block of 1×N building block library 742 into logical representation 730, yet change one of the default properties or add a property. A second way that an embodiment may create a child definition is by designating the number of children desired via a 1×N block builder, such as via 1×N block builder 150 of FIG. 1. A third way that an embodiment may create a child definition is by uniquifying a representation.

As FIG. 7A illustrates, apparatus 700 may comprise a uniquifier 702. Uniquifier 702 may comprise, e.g., a software element that operates during the 1×N compilation stage, such as during 1×N compilation 260 depicted in FIG. 2. Additionally, uniquifier 702 may correspond to uniquifier 320, depicted in FIG. 3.

Uniquifier 702 may be configured to compare a representation or a netlist and the current set of 1×N building blocks to determine whether any 1×N building blocks are reused. For example, uniquifier 702 may be configured to work in conjunction with equivalency-checker tool 718 to compare behavioral representation 722, logical representation 730, or physical design representation 736 with a uniquification list of the current set of 1×N building blocks, which may comprise 1×N building block library 742, to determine whether specific instances of 1×N building blocks in the library 742 are used multiple times in the representation.

If one or more 1×N building blocks are reused, attribute creator 703 may create parent-child definitions where such definitions do not already exist by adding or changing attributes of 1×N building blocks. Representation generator 705 may then generate a new representation that includes the added and/or changed attributes. For example, attribute creator 703 may create unique names for each child 1×N building block, wherein representation generator 705 generates an updated representation that includes the unique names. Additionally, in at least one alternative embodiment, representation generator 705 may be configured to prevent generating behavioral representation 722 that contains parent/child attributes. Such a configuration may be desirable when, e.g., the circuit designer needs to mask proprietary physical/electrical attributes.

Attribute creator 703 may create or change various types of attributes in different embodiments. For example, in numerous embodiments attribute creator 703 may create or change the attributes illustrated in FIG. 7B. As people having ordinary skill in the art will appreciate, alternative embodiments may create or change other types of attributes. Additionally, attribute creator 703 may create or change various types of attributes in different manners in different embodiments. For example, in some embodiments attribute creator 703 may create or change attributes by inserting or modifying a text field of a 1×N building block definition. In other embodiments, attribute creator 703 may create or change attributes by inserting or altering values of fields for the 1×N building block definitions. Even further, some embodiments may even create or change the attributes for the 1×N building blocks in different parts of the representation, such as in a section or portion of the representation associated with parent-child relationships. Even further, attribute creator 703 may create or change attributes via an external file which may be associated with the representation.

In some alternative embodiments, uniquifier 702 may also be configured to selectively ignore or uniquify specific sets of 1×N building blocks. Selectively ignoring or uniquifying specific sets of 1×N building blocks may prove to be useful, in that parent-child relationships may not need to be defined at logic entry. The parent-child relationships may be defined on-the-fly, as the relationships are required in individual design phases.

FIG. 7C illustrates a sample uniquification process whereby a 1×N building block "B" is reused in a netlist 790 multiple times (element 794). Again, netlist 790 may correspond to behavioral representation 722, logical representation 730, or physical design representation 736. An update to the 1×N building block "B" in the library, such as 1×N building block library 742, may result in a change to all instances of 1×N building block "B" in netlist 790 if netlist 790 were recompiled. However, when uniquifier 702 uniquifies netlist 790, uniquifier 702 may produce separate child 1×N building blocks for each instance of 1×N building block "B", depicted by 1×N building blocks 795, 796, and 797. Uniquifier 702 may insert 1×N building blocks 795, 796, and 797 directly in netlist 790, resulting in a modified netlist 798. In netlist 798, changes to the parent definition for 1×N building block "B" may apply to all of 1×N building blocks 795, 796, and 797. Contrastingly, an update to an individual child definition of 1×N building blocks 795, 796, or 797 may only be applicable to the updated 1×N building block. Additionally, uniquifier 702 may be arranged or configured to execute without manual intervention by a circuit designer.

In FIG. 7C, uniquifier 702 produced three separate 1×N building block definitions, such as uniquifying each instance of 1×N building block "B" (element 794) with three unique names. However, alternative embodiments may not uniquify all 1×N building block definitions. For example, an alternative embodiment may only assign unique names to 1×N building blocks 796 and 797, leaving the name in the definition for 1×N building block 795 as "B". Consequently, netlist 798 may comprise both parent and child definitions. Such an arrangement of representations having both parent and child building block definitions is depicted in each of the representations of circuit design file 720 in FIG. 7A. Alternative embodiments, such as an embodiment used to create netlist 798, may not permit unmodified parent 1×N building blocks to remain in a representation. In such an embodiment, each representation may uniquify all the 1×N building blocks of the design, such that no parent 1×N building blocks remain. For such embodiments, behavioral representation 722, logical representation 730, and physical design representation 736 may not comprise parent 1×N building blocks 724, 732, and 738, respectively.

One or more elements of apparatus 700 may be in the form of hardware, software, or a combination of both hardware and software. For example, in one embodiment, one or more of the modules of apparatus 700 may comprise software instructions of an application stored in a tangible medium, executed in memory by a processor of a computer. In other words, one embodiment of apparatus 700 may comprise portions of stored code for an application, which may design integrated circuits using a closed loop 1×N methodology, such as VLSI design application 145 shown in FIG. 1.

In alternative embodiments, one or more of the modules of apparatus 700 may comprise hardware-only modules. For example, in one embodiment 1×N compiler 706 may comprise a state machine that compiles different versions of netlists to generate the different forms of 1×N building blocks. A state machine 1×N compiler 706 may be desirable when, e.g., the designer needs to create the various representations in a rapid fashion, since a state machine compiler may be able to generate the representations considerably faster than a software-based compiler.

In some embodiments, attribute creator 703, representation generator 705, and equivalency-checker tool 718 may all reside in a single device, such as in memory 140 of computing system 100 shown in FIG. 1. For example, uniquifier 702 may include an equivalency-checker module, wherein uniquifier 702 may comprise a set of instructions stored in memory 140 that cause processor 105 to compare a representation or a netlist and the current set of 1×N building blocks to determine whether any 1×N building blocks are reused, create parent-child definitions where such definitions do not already exist, and generate a new representation that includes unique names for each child 1×N building block.

Alternatively, depending on the embodiment, one or more of the elements of apparatus 700 may reside in two or more devices. For example, in various embodiments, uniquifier 702 may reside in a local workstation, while equivalency-checker tool 718 may reside on a server. In other words, the circuit designer may use a client application on a local workstation that accesses a VLSI design application located on a remote server which has equivalency-checker tool 718.

The arrangement of apparatus 700 may vary in different embodiments. Some embodiments may have different elements than those modules depicted in FIG. 7A. Some embodiments may have additional modules, such as a back-annotator and one or more optimization and/or analysis tools. In other embodiments, apparatus 700 may include varying numbers of attribute creator 703, representation generator 705, and 1×N compiler 706. For example, one embodiment may have two or more representation generators 705. Such an arrangement may be necessary, e.g., to uniquify different forms of representations of the 1×N building blocks. Alternatively, numerous 1×N compilers 706 may be necessary to interact with incompatible or differing tools of tool suite 708. Many embodiments may include no 1×N compiler 706. For example, 1×N compiler 706 may comprise a part of a VLSI design application that is separate from uniquifier 702, such that uniquifier 702 is configured to operate separate from, yet in conjunction with, 1×N compiler 706.

Iterative Physical Design Cycle

The physical design phase may comprise the part of the design process that captures or generates the physical attributes of the circuit design. For example, a VLSI design application may capture the physical attributes related to floor planning, cell and 1×N building block placement, routing between the cells/blocks, noise reduction, power bussing, and design rule checking, as just a few examples. Embodiments that employ only classical design methodologies generally lose many of the changes made during the physical design phase due to the iterations through the logic and/or synthesis design phases.

Figure 4C:
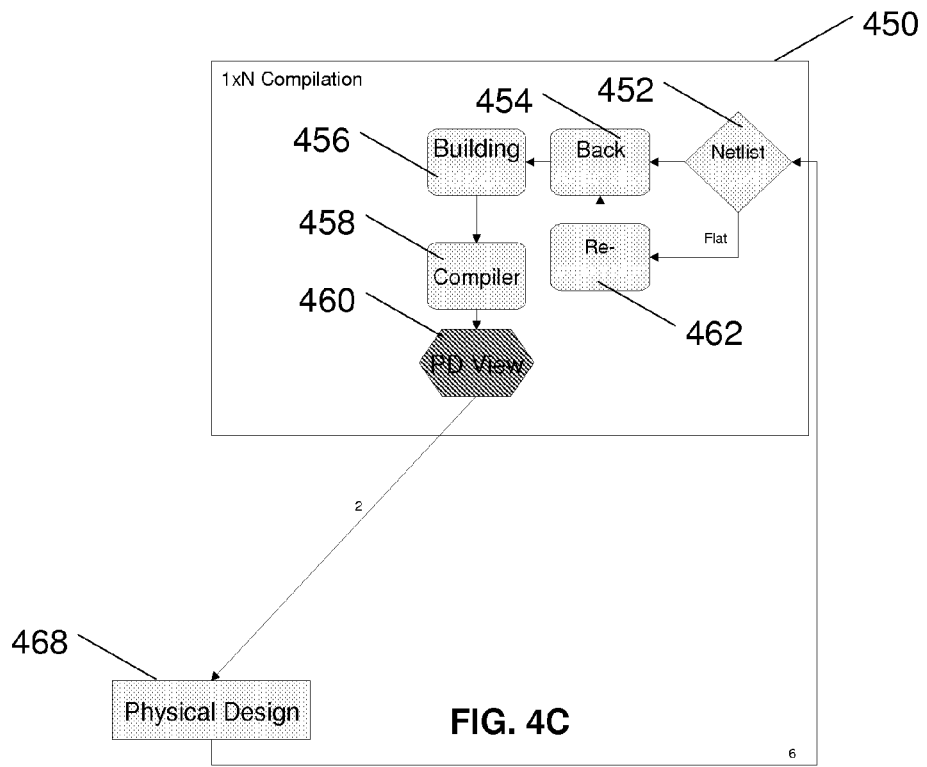
FIG. 4C illustrates a process of automatically maintaining changes made to the 1×N building blocks during a physical design phase via mechanisms of back-annotation and reassembly.

An embodiment employing a 1×N design methodology may automatically maintain changes made to the 1×N building blocks during the physical design phase via the mechanisms of back-annotation and reassembly. FIG. 4C illustrates the process of automatically maintaining changes made to the 1×N building blocks during the physical design phase via the mechanisms of back-annotator 454 and reassembler 462. For example, if a physical designer, or integrator, changes the relative spacing or bit-ordering of leaf cells in a 1×N building block 456 to ease routing congestion, an embodiment may capture the relative spacing or bit-ordering information in 1×N building block 456 and maintain the information through each successive design phase.

One flow of an iterative physical design stage may comprise reading different 1×N building blocks from a netlist of physical design 468. Depending on the type of netlist (element 452), an embodiment may reassemble the netlist via reassembler 462 and/or perform back-annotation via back-annotator 454 for the individual 1×N building blocks, such as 1×N building block 456. Embodiments may employ 1×N compiler 458 to compile the reassembled and back-annotated 1×N building blocks to generate physical design view 460.

An embodiment employing a 1×N design methodology may leverage the hierarchical nature of a physical design to make many physical design tasks more efficient through the use of scripting. For example, if an integrator wants to change the relative spacing of the leaf cells in 1×N building block 456, the embodiment employing the 1×N design methodology may not require the integrator to move each individual cell manually. Instead, the embodiment may allow the integrator to update 1×N building block 456 to reflect the desired spacing. The embodiment may then allow the integrator to recompile the design via 1×N compiler 458 and re-read the relative spacing changes into the design. The hierarchical 1×N building block 456 may be rewired on-the-fly, such as when the integrator is working on the design in physical design phase 240, so that the spacing changes are ready to use once the design is re-read. Subsequently, the integrator may resolve any potential overlaps between the 1×N building block and other random-logic cells and re-route the hierarchical connections.

An embodiment may make physical design tasks more efficient through the use of scripting for numerous types of transformations. For example, various embodiments may use scripting for relative placement of cells within 1×N building blocks, relative spacing of leaf cells, bit ordering, changes of cell types used in 1×N building blocks, and DFM/redundancy-for-test improved manufacturability implementations.

Embodiments employing dynamic updates to 1×N building blocks, such as 1×N building block 456, may not need to rely on pre-compiled sub-blocks that can be tiled together. Instead, 1×N compiler 458 may interpret the underlying physical structure of each cell and rewire 1×N building block 456 according to the cell placements described in 1×N building block 456. Interpreting the underlying physical structure and rewiring 1×N building block 456 may reduce turn-around-time for design optimizations and provide the designer or integrator with more physical detail information through each design phase.

Iterative Timing Cycle

Due to the nature of classical timing analysis tools, designers typically perform the timing design phase using flattened designs. Based on the results of the timing analyses, a designer may manually update the design to meet timing goals. Alternatively, the timing tool may also apply updates to the design. In other words, the timing tools may use various methods to communicate the recommended changes or updates and have the updates physically implemented in the design. Embodiments employing a 1×N design methodology may update 1×N building blocks in at least two ways. A first method may comprise updating 1×N building blocks through reassembly and back-annotation, whereby the embodiment recognizes design changes and feeds the changes or alterations back to other stages in the methodology. A second method may comprise incorporating the changes via on-the-fly editing and recompilation of 1×N building blocks. This secondary method may allow for more accurate timing information in a rapid fashion via scripting from a 1×N compiler.

Figure 4D:
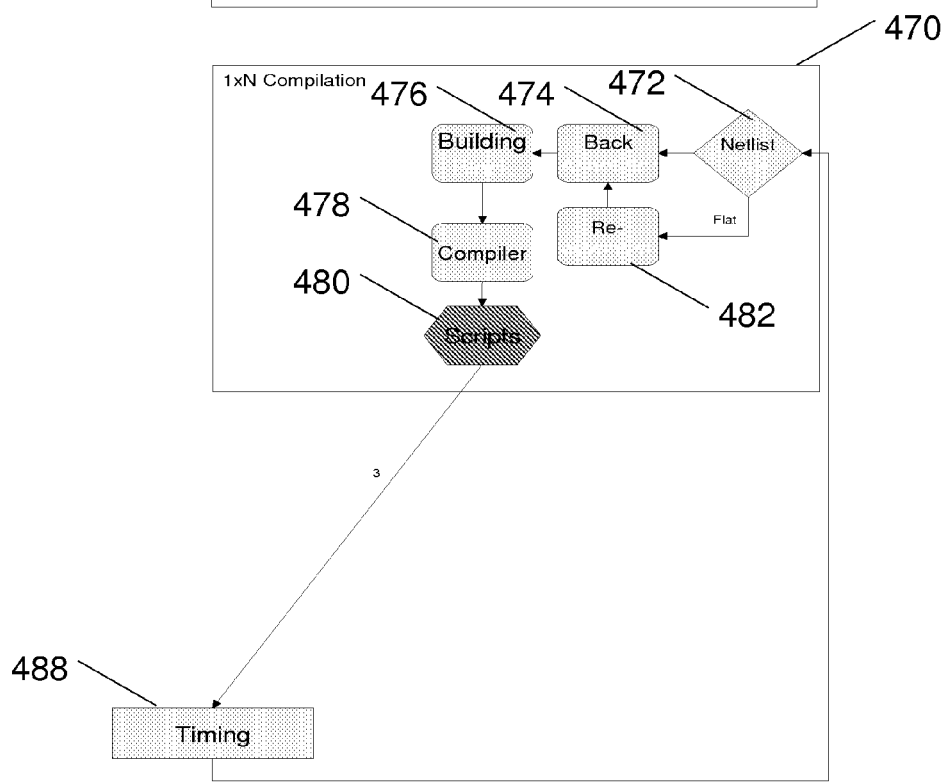
FIG. 4D illustrates one embodiment of a closed loop cycle between the elements of 1×N compilation and a timing analysis phase.

In a classical design flow, the timing team may make changes to the abstract or higher-level design, communicate the changes to the physical design team, and wait until the physical design team has incorporated the changes into the physical design. This interaction between the timing team and physical design team may be relatively slow in that the updates may need to be placed and routed before the updates can be analyzed in a timing analysis. Implementing the updates via placement and routing may require days. Once the physical design is ready to be analyzed for timing performance, the timing tool may take hours or days to produce the timing data for the designer depending on the complexity of the design. FIG. 4D illustrates how one or more embodiments employing a 1×N design methodology may improve this process.

FIG. 4D illustrates how an embodiment employing a 1×N design methodology may allow a designer to incorporate updates to a design that has 1×N building blocks. Depending on the type of netlist (element 472), an embodiment may reassemble the netlist via reassembler 482 and/or perform back-annotation via back-annotator 474 for an individual 1×N building block 476. The designer may be able to update 1×N building block 476, recompile the building block via 1×N compiler 478, produce a script 480 that can be read into a timing tool during a timing analysis phase 488, whereby the timing tool may update 1×N building block 476 by changing the physical implementation details of 1×N building block 476.

Changing 1×N building block 476 may not provide completely accurate timing results in some instances, because changes to 1×N building block 476 may affect other circuit elements, such as random logic gates. However, incorporating changes from a timing analysis using a 1×N design methodology may provide a greater degree of accuracy than a designer not using capabilities provided by a 1×N design methodology. Consequently, the designer may use the 1×N design methodology to reduce the time needed to update the physical design and meet timing goals, resulting in a quicker turnaround time for the design.

Script 480 generated from recompilation may not be limited to use in the timing design phase, nor to a specific set of transformations. Rather, 1×N compiler 478 may be configured to work with various tool sets for other phases of the design methodology and other desired transformations. For example, 1×N compiler 478 may be configured to work with placement and routing tools, DFM tools, design-rule checking tools, simulation tools, timing analysis tools, and other tools used in the logic, synthesis, physical design, and timing phases. Embodiments employing a 1×N building block methodology may provide the necessary design information for the various transformations through reassembly, back-annotation, and uniquification. Some embodiments may employ scripts for adding new 1×N building blocks to a design. Some embodiments may employ scripts for changing internal cell placement, internal rewiring, rewiring pins of a 1×N building block, and/or changing the functions for 1×N building blocks. Even further embodiments may employ scripts to delete specific 1×N building blocks from a design or remove internal cells of designated 1×N building blocks. As one skilled in the art will appreciate, scripts for 1×N building blocks may be used in a variety of different ways for a variety of different purposes. The example uses just cited are only a few of the possible uses.

Figure 8:
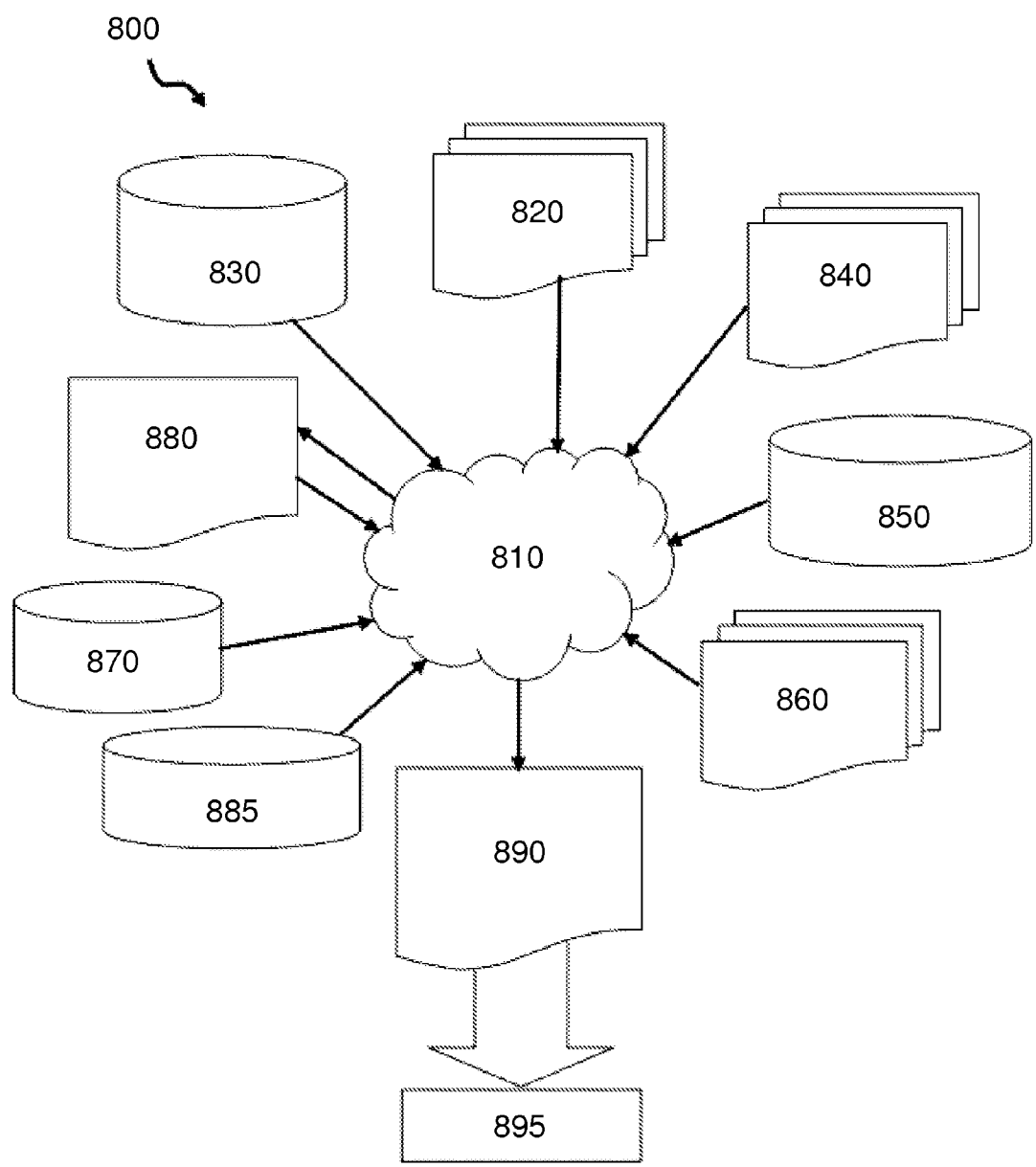
FIG. 8 is a flow diagram of a design process used in semiconductor design, manufacture, and/or test using a 1×N design methodology with parent-child relationships.

FIG. 8 shows a block diagram of an exemplary design flow 800 used for example, in semiconductor design, manufacturing, and/or test using a 1×N design methodology with parent-child relationships. Design flow 800 may vary depending on the type of IC being designed. For example, a design flow 800 for building an application specific IC (ASIC) may differ from a design flow 800 for designing a standard component. Design structure 820 is preferably an input to a design process 810 and may come from an IP provider, a core developer, or other design company or may be generated by the operator of the design flow, or from other sources. Design structure 820 comprises a product of an embodiment of the invention, such as netlist 185, design file(s) 135, 1×N building blocks 155, and cell library 130 as shown in FIG. 1, in the form of schematics or HDL, a hardware-description language (e.g., Verilog, VHDL, C, etc.). Design structure 820 may be contained on one or more machine readable mediums. For example, design structure 820 may be a text file or a graphical representation of an embodiment of the invention, such as storage device 125 as shown in FIG. 1. Design process 810 preferably synthesizes (or translates) a product of an embodiment of the invention as shown in FIG. 1 into a netlist 880, where netlist 880 is, for example, a list of wires, transistors, logic gates, control circuits, I/O, models, etc. that describes the connections to other elements and circuits in an integrated circuit design and recorded on at least one of machine readable medium. This may be an iterative process in which netlist 880 is resynthesized one or more times depending on design specifications and parameters for the circuit.

Design process 810 may include using a variety of inputs; for example, inputs from library elements 830 which may house a set of commonly used elements, circuits, and devices, including models, layouts, and symbolic representations, for a given manufacturing technology (e.g., different technology nodes, 32 nm, 45 nm, 90 nm, etc.), design specifications 840, characterization data 850, verification data 860, design rules 870, and test data files 885 (which may include test patterns and other testing information). Design process 810 may further include, for example, standard circuit design processes such as timing analysis, verification, design rule checking, place and route operations, etc. One of ordinary skill in the art of integrated circuit design can appreciate the extent of possible electronic design automation tools and applications used in design process 810 without deviating from the scope and spirit of the various embodiments.

The design structure is not limited to any specific design flow. Design process 810 preferably translates an embodiment of the invention as shown in FIG. 1, along with any additional integrated circuit design or data (if applicable), into a second design structure 890. Design structure 890 resides on a storage medium in a data format used for the exchange of layout data of integrated circuits (e.g. information stored in a GDSII (GDS2), GL1, OASIS, or any other suitable format for storing such design structures). Design structure 890 may comprise information such as, for example, test data files, design content files, manufacturing data, layout parameters, wires, levels of metal, vias, shapes, data for routing through the manufacturing line, and any other data required by a semiconductor manufacturer to produce a product of an embodiment of the invention, such as physical design representation 745 shown in FIG. 7. Design structure 890 may then proceed to a stage 895 where, for example, design structure 890: proceeds to tape-out, is released to manufacturing, is released to a mask house, is sent to another design house, is sent back to the customer, etc.

Figure 9:
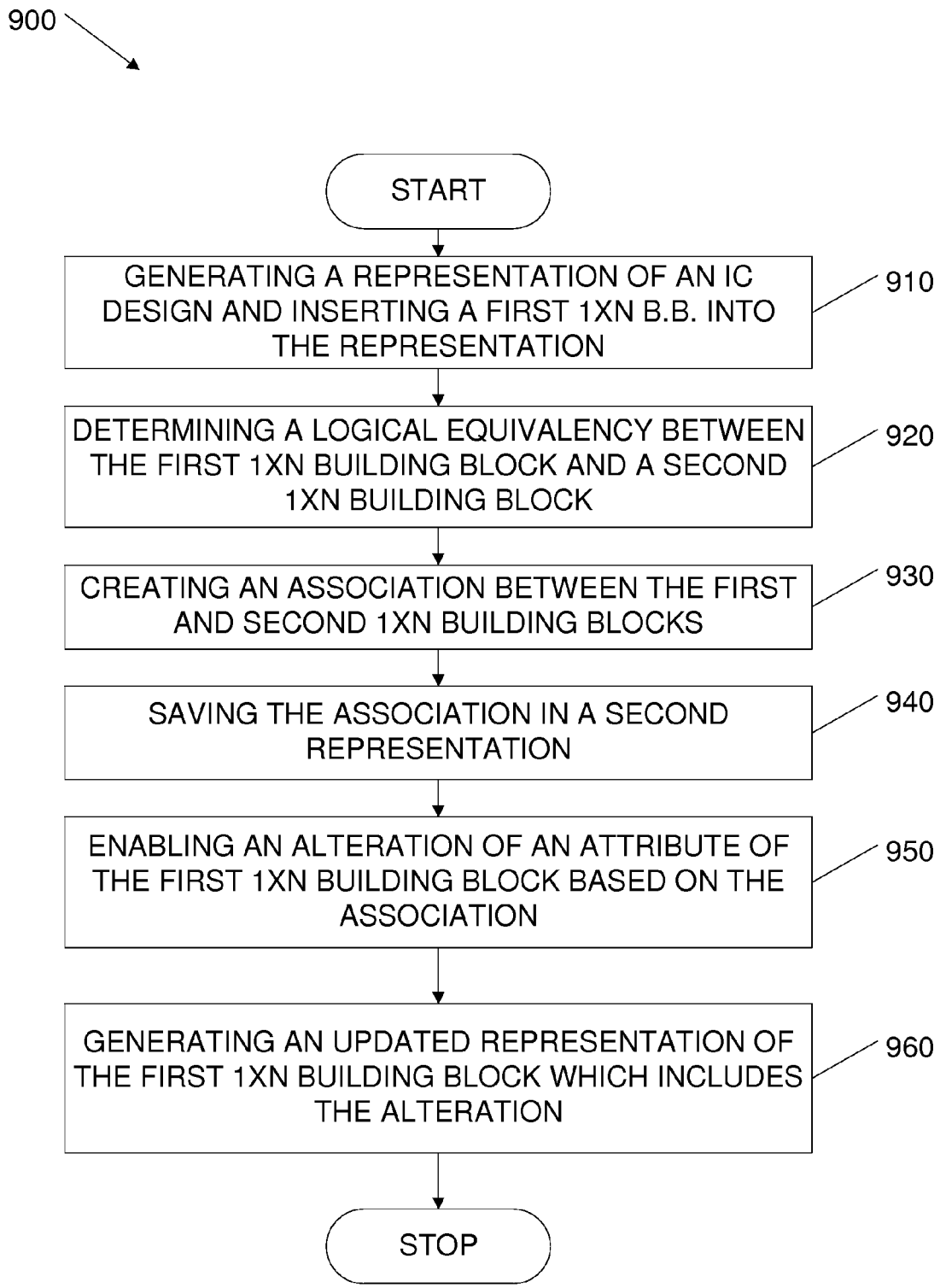
FIG. 9 depicts a flowchart illustrating how an embodiment may create parent-child relationships for reuse of 1×N building blocks.

FIG. 9 depicts a flowchart 900 illustrating how an embodiment may create parent-child relationships for reuse of 1×N building blocks. For example, one or more embodiments may be implemented as a computer program product comprising a computer readable storage medium including instructions that, when executed by a processor create parent-child relationships via attributes of 1×N building blocks.

As illustrated in FIG. 9, the process may involve generating a representation of an integrated circuit design and inserting a first 1×N building block into the representation (element 910). For example, a circuit designer may use one or more tools of tool suite 708 in conjunction with 1×N compiler 706 to create logical representation 730 from behavioral representation 722. The designer may then perform one or more optimizations on logical representation 730 using, e.g., synthesis tools 712 and timing analysis tools 716. The circuit designer may spot a problematic portion of the IC design, whereupon the designer decides to copy-and-paste three more instances of a 1×N building block in logical representation 730 using a schematic tool of synthesis tools 712.

The circuit designer may then recompile the modified logical representation 730, whereupon 1×N compiler 706 makes a call to equivalency-checker tool 718 to determine the logical equivalency between the 1×N building block and the three copied instances of the 1×N building block (element 920). After equivalency-checker 718 determines a logical equivalency between the 1×N building blocks, attribute creator 703 may create parent-child relationships between the original 1×N building block and the three copied instances by adding or changing attributes of one or more of the 1×N building blocks (element 930). For example, attribute creator 703 may create a unique name attribute for each of the three copied 1×N building blocks, as illustrated in FIG. 7B. Additionally, attribute creator 703 may insert an attribute in each copied 1×N building block that designates that the copied instance is a child of the original 1×N building block, such as by adding a "childof" attribute which refers to the name of the original 1×N building block. Different embodiments may create the parent-child relationship differently. For example, one embodiment may assign a number to each child 1×N building block and add one or more fields to the parent 1×N building block that refers to each of the child 1×N building blocks.

Representation generator 705 may then save the parent and/or child attributes added for the 1×N building blocks to a modified version of logical representation 730 (element 940), thereby creating the parent 1×N building block in parent 1×N building blocks 732 and creating the child 1×N building blocks in child 1×N building blocks 734.

The circuit designer may use one or more tools of logic design tools 710, synthesis tools 712, physical design tools 714, and timing analysis tools 716 to generate physical design representation 736 and change drive strengths for numerous 1×N building blocks or implement numerous improvements of various circuit components and elements of physical design representation 736. Upon a subsequent compilation, if any of the tools altered an attribute of the parent 1×N building block, 1×N compiler 706 may detect the parent-child relationships via the parent and/or child attributes and apply the alterations to each of the child 1×N building blocks, unless such attributes are overridden in the individual child 1×N building blocks (element 950).

The circuit designer may generate or create updated representations which include any alterations (element 960). For example, the circuit designer may recompile physical design representation 736 and logical representation 730 to create updated representations which include the attributes for the parent-child relationships and the alterations made by one or more tools of tool suite 708.

Another embodiment is implemented as a program product for implementing systems, apparatuses, and methods described with reference to FIGS. 1-9. Embodiments may take the form of an entirely hardware embodiment, an entirely software embodiment, or an embodiment containing both hardware and software elements. One embodiment is implemented in software, which includes but is not limited to firmware, resident software, microcode, etc.

Furthermore, embodiments may take the form of a computer program product accessible from a computer-usable or computer-readable medium providing program code for use by or in connection with a computer or any instruction execution system. For the purpose of describing the various embodiments, a computer-usable or computer readable medium may be any apparatus that can store the program for use by or in connection with the instruction execution system, apparatus, or device.

The medium can be an electronic, magnetic, optical, electromagnetic, or semiconductor system (or apparatus or device) medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code in order to reduce the number of times code is retrieved from bulk storage during execution. Input/output or I/O devices (including but not limited to keyboards, displays, pointing devices, etc.) can be coupled to the system either directly or through intervening I/O controllers.

Those skilled in the art, having the benefit of this disclosure, will realize that the present disclosure contemplates creating parent-child relationships for reuse of 1×N building blocks in a closed-loop 1×N system. The form of the embodiments shown and described in the detailed description and the drawings should be taken merely as examples. The following claims are intended to be interpreted broadly to embrace all variations of the example embodiments disclosed.

Although the present disclosure and some of its advantages have been described in detail for some embodiments, one skilled in the art should understand that various changes, substitutions, and alterations can be made herein without departing from the spirit and scope of the disclosure as defined by the appended claims. Although specific embodiments may achieve multiple objectives, not every embodiment falling within the scope of the attached claims will achieve every objective. Moreover, the scope of the present application is not intended to be limited to the particular embodiments of the process, machine, manufacture, composition of matter, means, methods, and steps described in the specification. As one of ordinary skill in the art will readily appreciate from this disclosure, processes, machines, manufacture, compositions of matter, means, methods, or steps presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
    generating, by a computing system, a representation of an integrated circuit design;
    inserting a first 1×N building block into the representation; and
    creating a relationship between the first 1×N building block and a second 1×N building block, wherein the first 1×N building block and the second 1×N building block are logically equivalent, and wherein the relationship enables the first 1×N building block to inherit attributes of the second 1×N building block and enables the first 1×N building block to comprise attributes which differ from attributes of the second 1×N building block, and wherein the representation comprises the first 1×N building block and the second 1×N building block, and wherein the representation comprises one of a behavioral representation, a logical representation, and a physical design representation of the integrated circuit design, and wherein the attributes which differ comprise one of drive-strength, Vt-hybridization, voltage-island, overhead cell type, and bit width; and
    determining the logical equivalency of the first 1×N building block and the second 1×N building block via a call of a 1×N compiler to an equivalency-checker tool, wherein the creating the relationship comprises comparing the representation with a uniquification list of the second 1×N building block to determine the logical equivalency.

2. The method of claim 1, further comprising saving the relationship in a second representation.

3. The method of claim 2, wherein the saving the relationship in the second representation comprises saving a line of text for the relationship for a definition of the first 1×N building block in the second representation.

4. The method of claim 1, wherein the creating the relationship comprises generating a unique name for the first 1×N building block, and wherein the saving the relationship comprises saving the relationship in one of a behavioral representation, a logical representation, and a physical design representation.

5. The method of claim 1, wherein the saving the relationship comprises incorporating a cloned bit if the logical equivalency is a non-inverted logical equivalency or incorporating an inverted bit if the logical equivalency is an inverted logical equivalency.

6. The method of claim 1, further comprising changing an attribute of the first 1×N building block, wherein the changing the attribute comprises changing at least one of the drive-strength, the Vt-hybridization, the voltage-island, the overhead cell type, the bit width, and physical cell placement.

7. The method of claim 6, wherein the changing the attribute of the first 1×N building block comprises altering an element of the first 1×N building via at least one of a logic design tool, a synthesis tool, a physical design tool, and a timing analysis tool.

8. An apparatus, comprising:
    an equivalency determiner to determine a logical equivalence between a first 1×N building block and a second 1×N building block, wherein the first 1×N building block is of a first representation of an integrated circuit;
    an attribute creator to create a set of attributes of the first 1×N building block, wherein the set of attributes enables the second 1×N building block to inherit a parent attribute of the first 1×N building block and enables the second 1×N building block to comprise a child attribute, and wherein the child attribute differs from a corresponding attribute of the first 1×N building, and wherein the creation of the set of attributes comprises comparing the first representation with a uniquification list of the second 1×N building block block, and wherein the child attribute comprises one of drive-strength, Vt-hybridization, voltage-island, and overhead cell type; and
    a representation generator to generate a second representation based on the first representation, wherein the second representation comprises the parent attribute and the child attribute.

9. The apparatus of claim 8, further comprising a tool to alter the child attribute, wherein the tool comprises at least one of a logic design tool, a synthesis tool, a physical design tool, and a timing analysis tool.

10. The apparatus of claim 8, wherein the equivalency determiner comprises an equivalency-checker tool of an integrated circuit design system.

11. The apparatus of claim 8, wherein the attribute creator enables the second 1×N building block to comprise a cloned bit if the logical equivalence is a non-inverting logical equivalence.

12. The apparatus of claim 8, wherein the attribute creator enables the second 1×N building block to comprise an inverted bit if the logical equivalence is an inverting logical equivalence.

13. The apparatus of claim 8, wherein the child attribute comprises at least one of drive-strength, Vt-hybridization, voltage-island, overhead cell type, and physical cell placement, and wherein the physical cell placement determines an arrangement of bits of the second 1×N building block.

14. The apparatus of claim 8, wherein the first representation comprises one of a logical representation and a physical design representation.

15. The apparatus of claim 8, wherein the second representation comprises one of a behavioral representation, a logical representation, and a physical design representation.

16. The apparatus of claim 8, wherein the second representation comprises one of a logical representation and a physical design representation, and wherein the representation generator is configured to prevent generating a behavioral representation comprising the parent attribute and the child attribute.

17. A computer program product comprising:
a tangible computer readable storage medium including stored instructions that, when executed by a processor:
determine a logical equivalency of a first 1×N building block and a second 1×N building block, wherein a representation of an integrated circuit comprises the first 1×N building block;
create a set of attributes of the first 1×N building block, wherein the set of attributes enables a first attribute of the first 1×N building block to equal a parent attribute of the second 1×N building block, and wherein the set of properties enables the first 1×N building block to comprise a child attribute that differs from attributes of the second 1×N building block, and wherein the creation of the set of attributes comprises comparing the first representation with a uniquification list of the second 1×N building block, and wherein the child attribute comprises one of drive-strength, Vt-hybridization, voltage-island, and overhead cell type; and
modify the representation based on the parent attribute and the child attribute.

18. The computer program product of claim 17, wherein the instructions that determine the logical equivalency determine whether the logical equivalency is a non-inverting logical equivalency or an inverting logical equivalency.

19. The computer program product of claim 18, wherein the parent attribute comprises at least one of drive-strength, Vt-hybridization, voltage-island, overhead cell type, and physical cell placement.

20. The computer program product of claim 19, wherein the representation comprises one of a behavioral representation, a logical representation, and a physical design representation.

21. A design structure stored in a tangible machine readable medium used in a design process, the design structure comprising:
an equivalency determiner to determine a logical equivalence between a first 1×N building block and a second 1×N building block via a uniquification list of the second 1×N building block, wherein the first 1×N building block is of a first representation of an integrated circuit;
a property creator to create a set of properties of the first 1×N building block via a comparison of the first representation with a uniquification list of the second 1×N building block, wherein the set of properties enables the first 1×N building block to inherit a parent attribute of the second 1×N building block and enables the first 1×N building block to comprise a child attribute, and wherein the child attribute differs from a corresponding attribute of the second 1×N building block, and wherein the child attribute comprises one of drive-strength, Vt-hybridization, voltage-island, and overhead cell type; and
a representation generator to generate a second representation based on the first representation, wherein the second representation comprises the parent attribute and the child attribute.

22. The design structure of claim 21, wherein the design structure comprises netlist.

23. The design structure of claim 21, wherein the design structure comprises at least one of test data, characterization data, verification data, and design specifications.

* * * * *